(12) United States Patent
Pyeon

(10) Patent No.: US 7,751,272 B2
(45) Date of Patent: Jul. 6, 2010

(54) SEMICONDUCTOR DEVICE AND METHOD FOR SELECTION AND DE-SELECTION OF MEMORY DEVICES INTERCONNECTED IN SERIES

(75) Inventor: Hong Beom Pyeon, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 323 days.

(21) Appl. No.: 12/025,866

(22) Filed: Feb. 5, 2008

(65) Prior Publication Data

US 2008/0198682 A1 Aug. 21, 2008

Related U.S. Application Data

(60) Provisional application No. 60/902,003, filed on Feb. 16, 2007, provisional application No. 60/891,108, filed on Feb. 22, 2007, provisional application No. 60/943,442, filed on Jun. 12, 2007.

(51) Int. Cl.
*G11C 8/00* (2006.01)
(52) U.S. Cl. ............... 365/230.06; 365/63; 365/230.03
(58) Field of Classification Search .................. 365/63, 365/230.03, 230.06
See application file for complete search history.

(56) References Cited

U.S. PATENT DOCUMENTS

| | | |
|---|---|---|
| 4,174,536 A | 11/1979 | Misunas et al. |
| 4,733,376 A | 3/1988 | Ogawa |
| 4,796,231 A | 1/1989 | Pinkham |
| 4,899,316 A | 2/1990 | Nagami |
| 5,038,299 A | 8/1991 | Maeda |
| 5,126,808 A | 6/1992 | Montalvo et al. |
| 5,136,292 A | 8/1992 | Ishida |
| 5,175,819 A | 12/1992 | Le Ngoc et al. |

(Continued)

FOREIGN PATENT DOCUMENTS

WO WO 01/69411 9/2001

(Continued)

OTHER PUBLICATIONS

Aritome, S. et al., "A Reliable Bi-Polarity Write/Erase Technology in Flash EEPROMS", Int'l. Electron Devices Meeting, 1990, Technical Digest, Dec. 9-12, 1990, pp. 111-114.

(Continued)

*Primary Examiner*—Hoai V Ho
*Assistant Examiner*—Fernando N Hidalgo

(57) ABSTRACT

A system includes a plurality of memory devices connected in-series that communicate with a memory controller. When a memory device receives a command strobe signal indicating the start of a command having an ID number, the memory device is placed in a de-selected state and the ID number is compared to the memory device's device address. Delayed versions of the command strobe signal and the command are forwarded while the memory device is in the de-selected state. If the ID number matches the device address with reference to the ID number, the memory device is placed in a selected state. In the selected state, the memory device may refrain from forwarding the delayed versions of the command strobe signal and the command, such that if there is a match, a truncated part of the command is forwarded before the memory device is placed in the selected state.

20 Claims, 11 Drawing Sheets

U.S. PATENT DOCUMENTS

| | | | |
|---|---|---|---|
| 5,243,703 A | 9/1993 | Farmwald et al. | |
| 5,280,539 A | 1/1994 | Yeom et al. | |
| 5,365,484 A | 11/1994 | Cleveland et al. | |
| 5,404,460 A | 4/1995 | Thomsen et al. | |
| 5,440,694 A | 8/1995 | Nakajima | |
| 5,452,259 A | 9/1995 | McLaury | |
| 5,473,563 A | 12/1995 | Suh et al. | |
| 5,473,566 A | 12/1995 | Rao | |
| 5,473,577 A | 12/1995 | Miyake et al. | |
| 5,596,724 A | 1/1997 | Mullins et al. | |
| 5,602,780 A | 2/1997 | Diem et al. | |
| 5,636,342 A | 6/1997 | Jeffries | |
| 5,671,178 A | 9/1997 | Park et al. | |
| 5,721,840 A | 2/1998 | Soga | |
| 5,729,683 A | 3/1998 | Le et al. | |
| 5,740,379 A | 4/1998 | Hartwig | |
| 5,761,146 A | 6/1998 | Yoo et al. | |
| 5,771,199 A | 6/1998 | Lee | |
| 5,802,006 A | 9/1998 | Ohta | |
| 5,818,785 A | 10/1998 | Ohshima | |
| 5,828,899 A | 10/1998 | Richard et al. | |
| 5,835,935 A | 11/1998 | Estakhri et al. | |
| 5,859,809 A | 1/1999 | Kim | |
| 5,872,994 A | 2/1999 | Akiyama et al. | |
| 5,937,425 A | 8/1999 | Ban | |
| 5,941,974 A | 8/1999 | Babin | |
| 5,959,930 A | 9/1999 | Sakurai | |
| 5,995,417 A | 11/1999 | Chen et al. | |
| 6,002,638 A | 12/1999 | John | |
| 6,085,290 A | 7/2000 | Smith et al. | |
| 6,091,660 A | 7/2000 | Sasaki et al. | |
| 6,107,658 A | 8/2000 | Itoh et al. | |
| 6,144,576 A | 11/2000 | Leddige et al. | |
| 6,148,364 A | 11/2000 | Srinivasan et al. | |
| 6,178,135 B1 | 1/2001 | Kang | |
| 6,230,233 B1 | 5/2001 | Lofgren et al. | |
| 6,304,921 B1 | 10/2001 | Rooke | |
| 6,317,350 B1 | 11/2001 | Pereira et al. | |
| 6,317,352 B1 | 11/2001 | Halbert et al. | |
| 6,438,064 B2 | 8/2002 | Ooishi | |
| 6,442,098 B1 | 8/2002 | Kengeri | |
| 6,453,365 B1 | 9/2002 | Habot | |
| 6,456,528 B1 | 9/2002 | Chen | |
| 6,535,948 B1 | 3/2003 | Wheeler et al. | |
| 6,584,303 B1 | 6/2003 | Kingswood et al. | |
| 6,594,183 B1 | 7/2003 | Lofgren et al. | |
| 6,601,199 B1 | 7/2003 | Fukuda et al. | |
| 6,611,466 B2 | 8/2003 | Lee et al. | |
| 6,658,582 B1 | 12/2003 | Han | |
| 6,680,904 B1 | 1/2004 | Kaplan et al. | |
| 6,715,044 B2 | 3/2004 | Lofgren et al. | |
| 6,717,847 B2 | 4/2004 | Chen | |
| 6,732,221 B2 | 5/2004 | Ban | |
| 6,754,807 B1 | 6/2004 | Parthasarathy et al. | |
| 6,763,426 B1 | 7/2004 | James et al. | |
| 6,807,103 B2 | 10/2004 | Cavaleri et al. | |
| 6,807,106 B2 | 10/2004 | Gonzales et al. | |
| 6,816,933 B1 | 11/2004 | Andreas | |
| 6,850,443 B2 | 2/2005 | Lofgren et al. | |
| 6,853,557 B1 | 2/2005 | Haba et al. | |
| 6,853,573 B2 | 2/2005 | Kim et al. | |
| 6,928,501 B2 | 8/2005 | Andreas et al. | |
| 6,944,697 B2 | 9/2005 | Andreas | |
| 6,950,325 B1 | 9/2005 | Chen | |
| 6,967,874 B2 | 11/2005 | Hosono | |
| 6,996,644 B2 | 2/2006 | Schoch et al. | |
| 7,073,022 B2 | 7/2006 | El-Batal et al. | |
| 7,123,541 B2 | 10/2006 | Bell et al. | |
| 7,190,617 B1 | 3/2007 | Harari et al. | |
| 7,342,816 B2 * | 3/2008 | Bartley et al. | 365/63 |
| 2002/0161941 A1 | 10/2002 | Chue et al. | |
| 2004/0001380 A1 | 1/2004 | Becca et al. | |
| 2004/0019736 A1 | 1/2004 | Kim et al. | |
| 2004/0024960 A1 | 2/2004 | King et al. | |
| 2004/0039854 A1 | 2/2004 | Estakhri et al. | |
| 2004/0230738 A1 | 11/2004 | Lim et al. | |
| 2005/0160218 A1 | 7/2005 | See et al. | |
| 2005/0213421 A1 | 9/2005 | Polizzi et al. | |
| 2006/0050594 A1 | 3/2006 | Park | |
| 2006/0262611 A1 * | 11/2006 | Lee et al. | 365/189.12 |
| 2007/0091707 A1 * | 4/2007 | Hidaka | 365/230.03 |

FOREIGN PATENT DOCUMENTS

| | | |
|---|---|---|
| WO | PCT/CA2007/001428 | 2/2008 |
| WO | PCT/CA2008/000219 | 8/2008 |

OTHER PUBLICATIONS

Shirota, R., et al., "A 2.3um2 Memory Cell Structure for 16Mb NAND EEPROMs", International Electron Devices Meeting 1990, Technical Digest, (1990), pp. 103-106.

Hara, T. et al., "A 146-mmΛ2 8-Gb Multi-Level NAND Flash Memory With 70-nm CMOS Technology", IEEE Journal of Solid State Circuits, Jan. 2006, vol. 41, No. 1, pp. 161-169.

Lee, S. et al., "A 3.3V 4Gb Four-Level NAND Flash Memory with 90nm CMOS Technology", ISSCC 2004/Session 2 Non-Volatile Memory/2.7, IEEE International Solid-State Circuits Conference, Feb. 15-19, 2004,Digest of Technical Papers, pp. 52-513, vol. 1, XP010722148, ISBN: 0-7803-8267-6.

Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Feb. 6-9, 2006, ISBN: 1-4244-0079-1.

Samsung Electronics Co. Ltd, "256M×8 Bit/ 128 M×16 Bit/ 512M×8 Bit NAND Flash Memory", K9K4G08U1M, May 6, 2005, pp. 1-41.

Samsung Electronics Co. Ltd, "1G×8 Bit/ 1G×8 Bit NAND Flash Memory", K9F8G08UXM, May 31, 2007, pp. 1-54.

Samsung Electronics Co. Ltd, "512M×8 Bit/ 1G×8 Bit NAND Flash Memory", K9XXG08UXA, May 7, 2006, pp. 1-43.

Samsung Electronics Co. Ltd, "1G×8 Bit/ 2G×8 Bit/ 4G×8 Bit NAND Flash Memory", K9XXG08UXA, Jul. 18, 2006, pp. 1-50.

Choi, Young, "16-Gbit MLC NAND Flash Weighs In", EETimes. com, Jul. 7, 2007, pp. 1-3, http://www.eetimes.com/showArticle.jhtml?articleID=201200825.

Gal, et al., "Algorithms and data structures for flash memories", ACM Computing Surveys (CSUR), vol. 37, No. 2, p. 138-163, Jun. 2005, Tel Aviv University.

Lee J. et al., "A 90-nm CMOS 1.8-V 2Gb NAND Flash Memory for Mass Storage Applications", IEEE Journal of Solid-State Circuits, vol. 38, No. 11, Nov. 2003, pp. 1934-1942.

Samsung Electronics Co. Ltd, "2G×8 Bit NAND Flash Memory", K9GAG08U0M, Apr. 12, 2006, pp. 1-48.

Toshiba, "16 Gbit (2G×8 Bit) CMOS NAND E2PROM (Multi-Level-Cell)", TC58NVG4D1DTG00, Nov. 9, 2006.

Toshiba, "2Gbit (256M×8 Bits) CMOS NAND E2PROM", TH58NVG1S3AFT05, May 19, 2003.

Intel Corporation, "Intel® Advanced+ Boot Block Flash Memory (C3)", May 2005, pp. 1-72.

King, et al., "Communicating with Daisy Chained MCP42XXX Digital Potentiometers", Microchip AN747, pp. 1-8, 2001.

Amtel Corp., "High Speed Small Sectored SPI Flash Memory", pp. 1-22, 2006.

64 Megabit CMOS 3.0 Volt Flash Memory with 50MHz SPI, Spansion, pp. 1-22 (2006).

M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.

Tal, A., "Guidelines for Integrating DiskOnChip in a Host System", AP-DOC-1004, Rev. 1.0, M-Systems Flash Pioneers Ltd., pp. 1-15, 2004.

Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.

Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.

Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.

"HyperTransport TM I/O Link Specification", Revision 2.00, Document No. HTC20031217-0036-00, Hypertransport Technology Consortium, pp. 1-325, 2001.

"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCom 1992, IEEE 0-8186-2655-0/92, pp. 328-331, Feb. 24-28, 1992.

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

Gjessing, S., et al., "A RAM Link for High Speed", Special Report/Memory, IEEE Spectrum, pp. 52-53, Oct. 1992.

Diamond, S.L., "SyncLink: High: High-speed DRAM for the Future", Micro Standards, IEEE Micro, pp. 74-75, Dec. 1996.

Samsung Electronics, "DDR2 Fully Buffered DIMM 240pin FBDIMMS based on 512Mb C-die" Rev. 1.3, Sep. 2006, pp. 1-32.

"HyperTransport TM I/O Link Specification", Revision 3.00, Document No. HTC20051222-0046-0008, Hypertransport Technology Consortium, pp. 1-428, Apr. 2006.

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, pp. 46 and 47.

Tanzawa, T. et al., "Circuit Techniques for a 1.8-V-Only NAND Flash Memory", IEEE Journal of Solid-State Circuits, vol. 37, No. 1, Jan. 2002, pp. 84-89.

Saito, et al., "A Programmable 80ns 1Mb CMOS EPROM", IEEE ISSCC Digest of Technical Papers, Feb. 14, 1985, pp. 176-177, 340.

Momodomi, M. et al., "A 4 Mb NAND EEPROM with tight programmed Vt Distribution", IEEE Journal of Solid-State Circuits, vol. 26, Issue 4, Apr. 1991, pp. 492-496.

Ohtsuka, N. et al., "A 4-Mbit CMOS EPROM", IEEE Journal of Solid-State Circuits, vol. 22, Issue 5, Oct. 1987, pp. 669-675.

Kim, et al. "A 120-mm2 64 Mb NAND Flash Memory Archieving 180 ns/Byte Effective Program Speed," IEEE Journal of Solid-State Circuits, vol. 32, No. 5, May 1977, pp. 670-680.

Suh, K. et al., "A 3.3 V 32 Mb NAND Flash Memory with Incremental Step Pulse Programming Scheme", IEEE Journal of Solid-State Circuits, vol. 30, No. 11, Nov. 1995, pp. 1149-1156.

Takeuchi, K. et al., "A multipage cell architecture for high-speed programming multilevelNAND flash memories", IEEE Journal of Solid-State Circuits, vol. 33, Issue 8, Aug. 1998, pp. 1228-1238.

Tanzawa, et al., "A dynamic analysis of the Dickson charge pump circuit;" IEEE J. Solid-State Circuits, vol. 32, No. 8, pp. 1231-1240, Aug. 1997.

Tanaka, T. et al., "A quick intelligent page-programming architecture and a shieldedbitline sensing method for 3 Vonly NAND flash memory", IEEE Journal of Solid-state Circuits, vol. 29, Issue 11, Nov. 1994, pp. 1366-1373.

Imamiya, K. et al., "A 125-mm2 1-Gb NAND Flash Memory with 10-MByte/s Program Speed", IEEE Journal of Solid-State Circuits, vol. 37, No. 11, Nov. 2002, pp. 1493-1501.

Lee, J. et al., "High-Performance 1-Gb NAND Flash Memory with 0.12-•m Technology", IEEE Journal of Solid-State Circuits, vol. 37, No. 11, Nov. 2002, pp. 1502-1509.

Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

Tomita, N. et al., "A 62-ns 16Mb CMOS EPROMm with Voltage Stress Relaxation Technique" IEEE Journal of Solid-State Circuits vol. 26, No. 11, Nov. 1991, pp. 1593-1599.

Kirisawa, R. et al., "A NAND Structured Cell with a new Programming Technology for Highly Reliable 5V-Only Flash EEPROM", 1990 Symposium on VLSI Technology, Jun. 4, 1990, CH 2874-6, 90/0000-0129 1990 IEEE, Honolulu, US, pp. 129-130.

\* cited by examiner

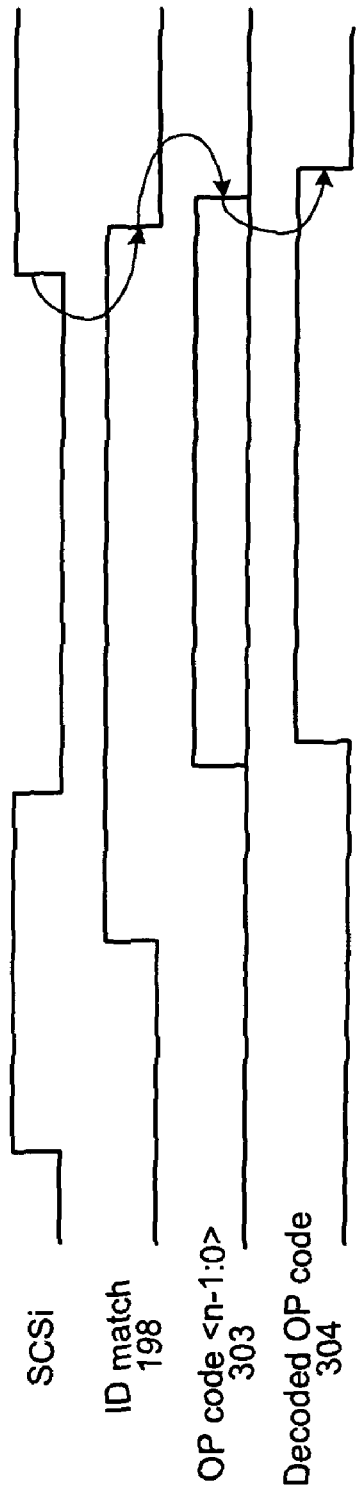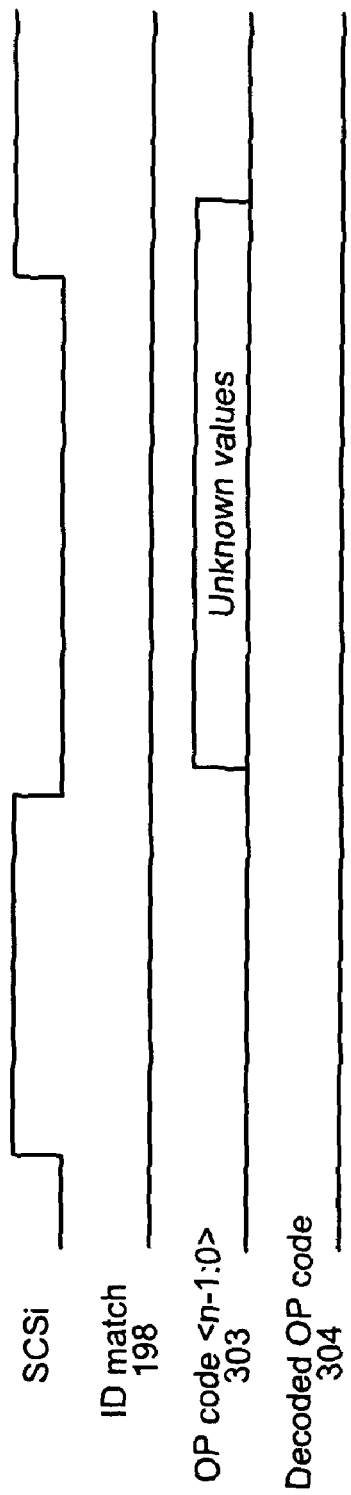

SEMICONDUCTOR DEVICE AND METHOD FOR SELECTION AND DE-SELECTION OF MEMORY DEVICES INTERCONNECTED IN SERIES

CROSS REFERENCE TO RELATED APPLICATIONS

This application claims the benefit of priority from U.S. Provisional Patent Application No. 60/902,003 filed Feb. 16, 2007; U.S. Provisional Patent Application No. 60/891,108 filed Feb. 22, 2007; and U.S. Provisional Patent Application No. 60/943,442 filed Jun. 12, 2007, the disclosures of which are expressly incorporated herein by reference in their entirety.

FIELD OF THE INVENTION

The present invention relates generally to semiconductor devices. More particularly, the present invention relates to a system having an arrangement having a plurality of semiconductor devices.

BACKGROUND OF THE INVENTION

Most memory systems utilize a multi-drop connection between the memory controller and multiple memory devices to increase the memory density on the system board and at the package level. However, this approach does not guarantee good signal integrity and enough timing margin in high speed applications, for example, over 100 MHz frequency. Therefore, there is a need for an alternative memory system architecture that achieves acceptable signal integrity for high speed applications. Such an alternative has been found in architectures that feature multiple devices that are serially interconnected. In such architecture, a memory controller is connected to a first memory device with a link, and that memory device is connected to a next memory device with another link and so on. The use of links between devices overcomes some of the problems with signal integrity for high speed applications. However, unlike a multi-drop architecture, where specific devices can be activated while remaining devices are passive, all of the devices in a serially interconnected architecture are active because they must be available to pass signals on to the next device in the serial interconnection.

SUMMARY OF THE INVENTION

According to one broad aspect of the present invention, there is provided a memory device for use in an arrangement of memory devices interconnected in series. The memory device comprises: a first input for receiving a command input signal containing a command and an identification number; a second input for receiving a first strobe signal indicating the start of command; and logic circuitry. The logic circuitry is configured to: de-select the memory device in response to the first strobe signal to place the memory device in a de-selected state; determine whether the identification number of the command matches a device address associated with the memory device; and in response to a determination result, place the memory device in a selected state.

The logic circuitry may be further configured to: refrain from forwarding the command input signal and the first strobe signal while the memory device is in the selected state; and transfer the command input signal and the first strobe signal while the memory device is in the de-selected state.

Advantageously, if there is no match, the memory device stays in the de-selected state and the entire command is forwarded. If there is a match, only a truncated part of the command is forwarded before the memory device is placed in the selected state.

The memory device may further include a third input for receiving clock input. The command input signal is forwarded with a delay related to clock cycle latency while the memory device is in the de-selected state. The command strobe signal may be forwarded with a delay related to clock cycle latency while the memory device is in the de-selected state.

The memory device may further include a fourth input for receiving a second strobe signal containing data enabling data output from the memory device in the selected state. The logic circuitry may forward the second strobe signal with a delay related to a latency that is substantially equal to the latency of a delayed version of the command strobe signal.

According to another broad aspect of the present invention, there is provided a method in a memory device in an arrangement of memory devices interconnected in series. The method comprises: receiving a command input signal containing a command; receiving a command strobe signal containing a command strobe indicating the start of command; forwarding the command input signal and the command strobe signal with delays while the memory device is in a de-selected state; de-selecting the memory device when the command strobe signal is received at the start of the command to place the memory device in the de-selected state; determining whether an identification number of the command matches a device address associated with the memory device; and placing the memory device in a selected state if the identification number of the command matches the device address associated with the memory device.

The method may further comprise refraining from forwarding the command input signal and the command strobe signal with delays while the memory device is in the selected state.

According to another broad aspect of the present invention, there is provided a system comprising: a memory controller; and a plurality of memory devices interconnected in series, each of the devices including: a first input for receiving a command input signal containing a command and an identification number; a second input for receiving a first strobe signal indicating the start of command; and logic circuitry. The logic circuitry is configured to: de-select the memory device in response to the first strobe signal to place the memory device in a de-selected state; determine whether the identification number of the command matches a device address associated with the memory device; and in response to a determination result, place the memory device in a selected state.

According to an embodiment of the present invention, there is provided a system includes a plurality of memory devices connected in-series and a memory controller. When a memory device receives a command strobe signal indicating the start of an incoming command, the memory device is placed in a de-selected state and an ID number of the command is compared to the device address of the memory device. While the memory device is in the de-selected state, delayed versions of the command strobe signal and the command are forwarded. If the ID number matches the device address, the memory device is placed in a selected state. In the selected state, the memory device refrains from forwarding the delayed versions of the command strobe signal and the command. If there is a match, a truncated part of the command is forwarded before the memory device is placed in the selected state.

Other aspects and features of the present invention will become apparent, to those ordinarily skilled in the art, upon review of the following description of specific embodiments of the invention.

BRIEF DESCRIPTION OF THE DRAWINGS

Embodiments will now be described with reference to the attached drawings in which:

FIGS. 6A and 6B are signaling diagrams of example signals in the circuitry shown in FIGS. 4B and 4C;

DETAILED DESCRIPTION

In the following detailed description of sample embodiments of the invention, reference is made to the accompanying drawings which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

The present invention relates generally to a system having an arrangement including a plurality of semiconductor devices. The devices may operate with different power consumption levels. Examples of the semiconductor devices are processors and memory devices that may operate with different power consumption levels. The memory devices may be volatile memory devices (e.g., random accesses memories) or non-volatile memory devices (e.g., flash devices).

Examples described herein can find application in serial interconnections having a plurality of devices connected in-series. More generally, the embodiments described herein can find application in system architectures employing serial interconnection configurations having a plurality of semiconductor devices connected in-series by serial links or parallel links. Serial interconnection arrangements form a subset of architectures in which devices are connected together in-series with serial or parallel links.

Examples of detailed memory system architectures that employ memory devices interconnected in series are provided in commonly assigned and co-pending U.S. patent application Ser. No. 11/594,564 entitled "Daisy Chain Cascading Devices" filed on Jul. 31, 2006, the disclosure of which is hereby incorporated by reference in its entirety. Other example details of memory devices interconnected in series are provided in U.S. Provisional Patent Application Ser. No. 60/868,773 entitled "System and Method of Operating Memory Devices of Varying Type" filed on Dec. 6, 2006, U.S. Provisional Patent Application Ser. No. 60/943,442 entitled "System and Method for Reducing power Consumption in a Memory System having Memory Devices Interconnected in Series" filed Jun. 12, 2007, the disclosures of which are hereby incorporated by reference in their entireties. The embodiments described herein can find application in memory system architectures employing memory devices interconnected in series by serial links or parallel links. An overview of a memory system architecture having memory devices interconnected in series is provided with reference to FIG. 1.

Figure 1:
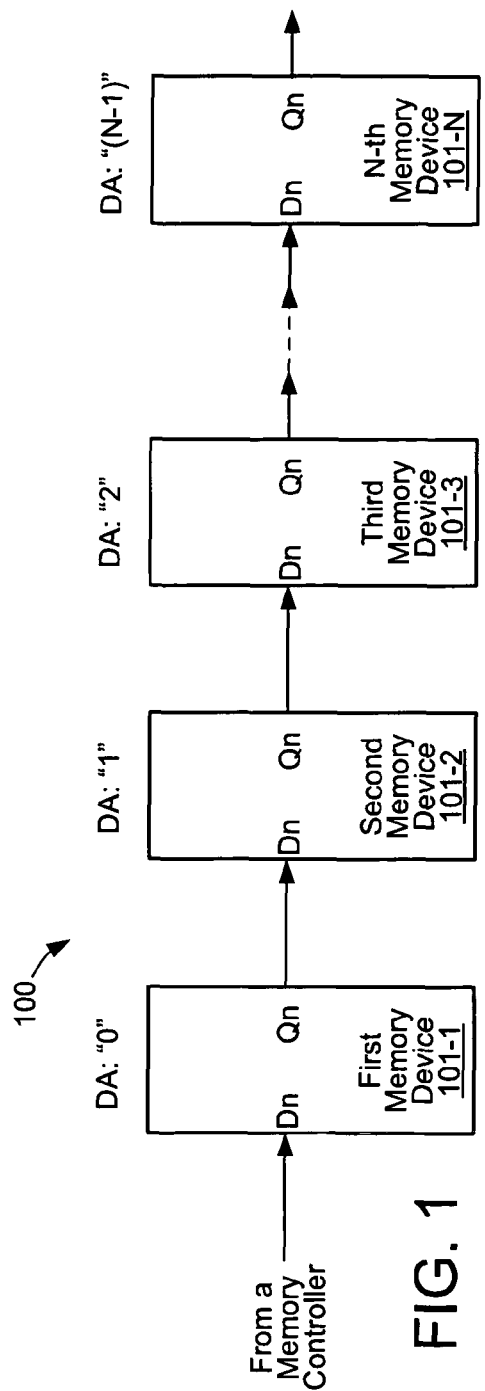
FIG. 1 is a block diagram of a plurality of memory devices interconnected in series, to which embodiments of the present invention are applicable.

FIG. 1 shows an arrangement of a plurality of memory devices interconnected in series to which embodiments of the present invention are applicable. Referring to FIG. 1, an arrangement 100 includes N memory devices 101-1, 101-2, 101-3, - - -, and 101-N that are series-connected, N being an integer. A memory controller (not shown) sends a group of signals of data and information to the memory devices of the arrangement 100. Data or information to be processed is sent to the first device 101-1 and propagated through the devices of the series interconnected arrangement 100 under conditions. In one implementation, the output of the last device 101-N is open. In another implementation, the output of the last device 101-N is connected to the memory controller (not shown), so that the memory controller can use the feedback data from the last device 101-N.

Each of the memory devices 101-1, 101-2, 101-3, - - -, and 101-N of the series interconnected arrangement 100 has a unique device address (DA) or device identification number (ID). In the illustrated example, the device addresses of the device 101-1, 101-2, 101-3, - - -, and 101-N are "0", "1", "2", - - -, and "N−1", respectively. In a case of N being 15, the device addresses (DAs) are represented by four bit binary codes '0000', '0001', '0010', - - -, and '1110', respectively. Each device has its MSB (most significant bit) first and has its LSB (least significant bit) last. In another implementation, the DA can be changed to the LSB first and the MSB last. Also, the DAs can be successive numbers from another value (e.g., "1"). Furthermore, the DAs can be decremented numbers from a maximum value.

Examples of the device address assignment in a plurality of memory devices that are connected in-series are provided in U.S. Provisional Patent Application No. 60/787,710, filed Mar. 28, 2006; U.S. patent application Ser. No. 11/521,734 filed Sep. 15, 2006; U.S. Provisional Patent Application No. 60/802,645, filed May 23, 2006; and U.S. patent application Ser. No. 11/750,649 filed May 18, 2007, the disclosures of which are incorporated by reference in their entirety.

The memory controller issues control information including a specific device address and a command. The memory device identified by the specific device address executes the command, in accordance with device address matching. Examples of the command are memory accesses and data processes. Each command includes an ID number (i.e., a device address) and a command OP code (hereinafter simply 'OP code'), and may also include address information and/or data.

Figure 2:
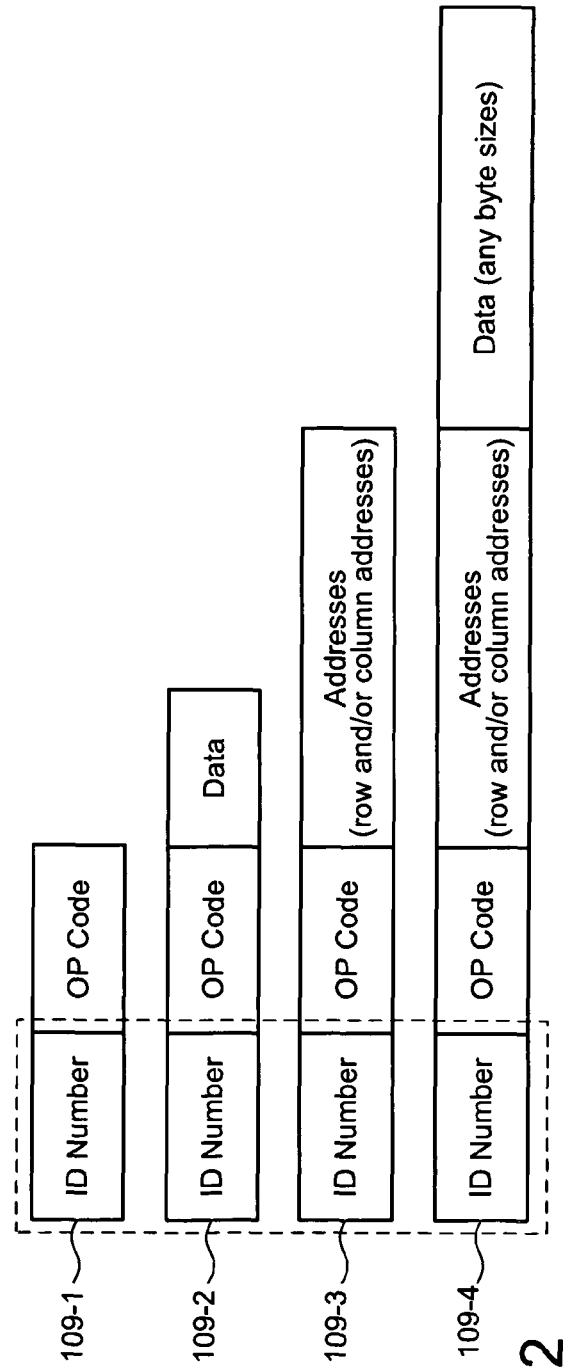
FIG. 2 is a schematic of example command formats for the memory devices interconnected in series.

FIG. 2 is a schematic of example command formats for the memory devices interconnected in series. Referring now to FIG. 2, a first command format 109-1 includes an ID number and an OP code. The ID number is used to uniquely identify a selected memory device, while the OP code field contains the OP code to be executed by the selected device. Commands with the first command format 109-1 may for example be used for commands containing OP codes for reading a register value. A second command format 109-2 includes an ID number, an OP code and data. Commands with the second command format 109-2 may for example be used for commands containing OP codes for writing data to a register. A third command format 109-3 includes an ID number, an OP code, and additional addresses. The additional addresses may for example include row and/or column addresses for addressing a location in memory cells. Commands with the third command format 109-3 may for example be used for commands containing OP codes for reading data from memory cells of a selected memory device. A fourth command format 109-4 includes an ID number, an OP code, additional addresses, and data. Commands with the fourth command format 109-4 may for example be used for commands containing OP codes for writing data to the memory cells of a selected memory device. Note that all four example command formats 109-1, 109-2, 109-3, 109-4 start with an ID number for addressing purposes. It should be understood from the foregoing that the term "command" as used herein does not merely refer to a command OP code, as a command may include an ID number, an OP code, additional addresses, data, or any other information relating to the control of an arrangement of memory devices interconnected in series.

Figure 3A:
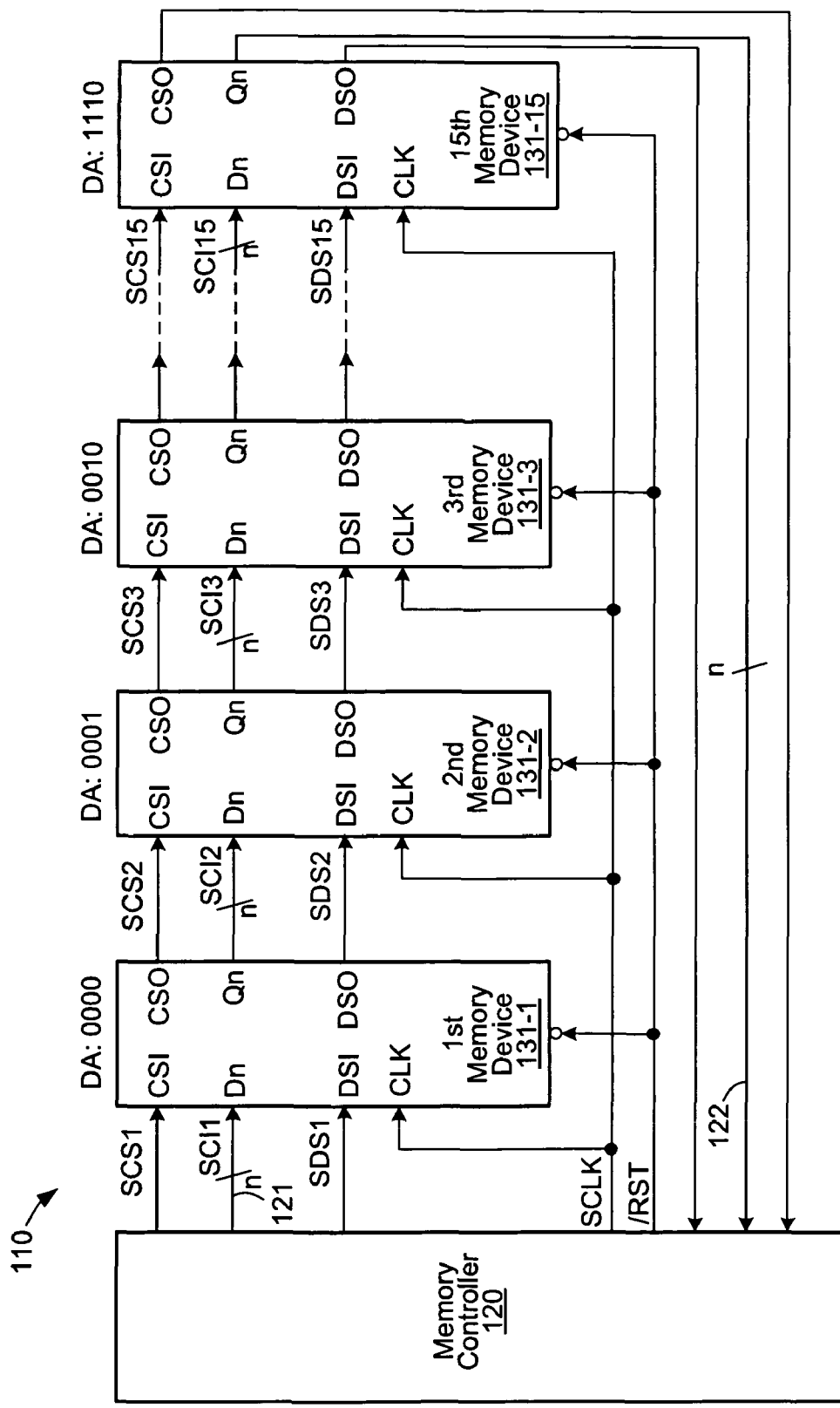
FIG. 3A is a block diagram of a system having a memory controller and a plurality of memory devices interconnected in series, to which embodiments of the present invention are applicable.
Figure 3B:
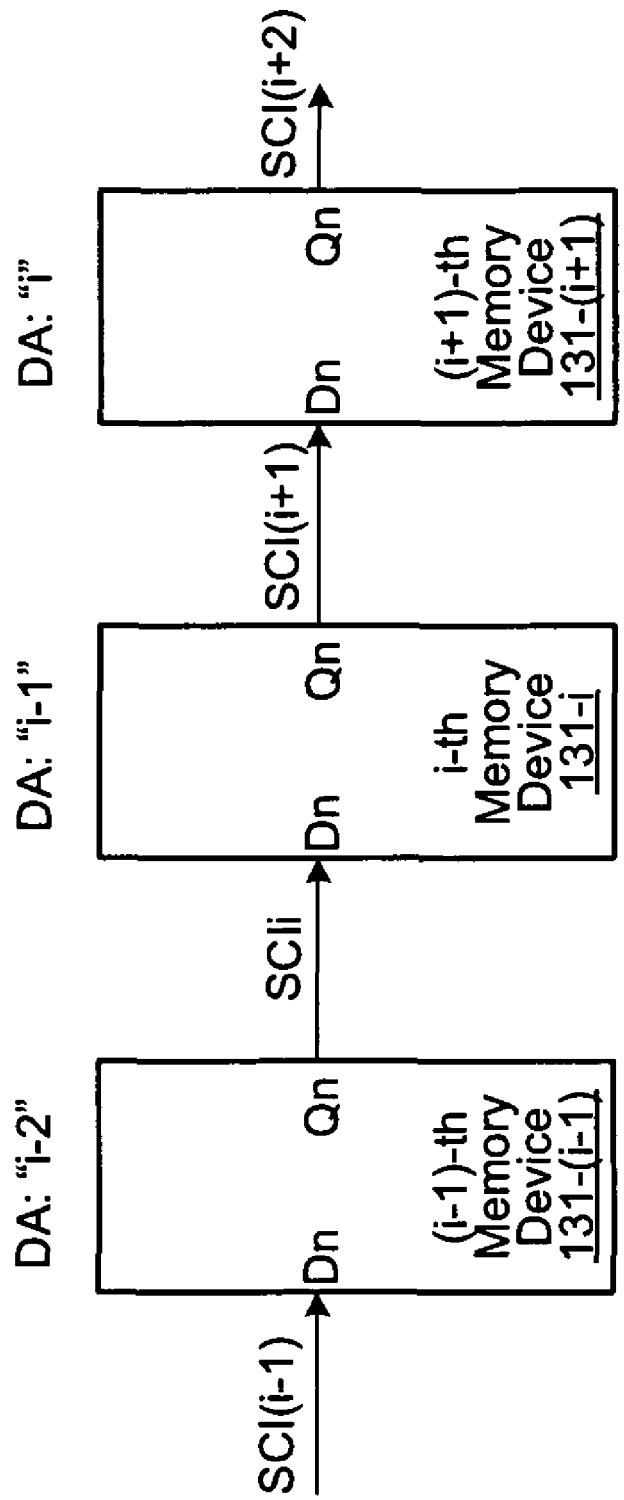
FIG. 3B is a block diagram showing part of the series-connected memory devices shown in FIG. 3A.

FIG. 3A shows a system having a memory controller and a plurality of memory devices to which embodiments of the present invention are applicable. FIG. 3B shows part of the series-connected memory devices shown in FIG. 3A. As shown, command input signal SCIi input to a device 131-i can be transmitted to the next device 131-(i+1).

Referring to FIGS. 3A and 3B, a system 110 includes a plurality (N) of memory devices interconnected in series, where N is an integer. In the illustrated example, the number of devices N is 15 and thus, memory devices 131-1, 131-2, 131-3, - - - , and 131-15 are interconnected in series. The system 110 also includes a memory controller 120 connected to the first memory device 131-1 via a link 121. Each pair of adjacent memory devices is similarly connected via a link. In the illustrated example, the last (15th) memory device 131-15 is connected to the memory controller 120 via a link 122, thereby creating a specific type of series architecture, namely a ring configuration with a feedback path. Alternatively, if the last memory device 131-15 is not connected to the memory controller 120, the series architecture would be a non-feedback configuration. In a non-feedback configuration, the last memory device 131-15 may be connected to some other component instead of the memory controller 120. Ring configuration and non-feedback configuration are both examples of architectures featuring devices connected together in series.

The links interconnecting the memory devices 131-1, 131-2, 131-3, - - - , and 131-15 are used to transmit commands over a path that traverses the memory devices 131-1, 131-2, 131-3, - - - , and 131-15. As part of the path, the first memory device 131-1 has a command input Dn and a corresponding command output Qn. Similarly, each of the other memory devices 131-2, 131-3, - - - , and 131-15 has a command input Dn and a corresponding command output Qn. In the illustrated example, the links of the path form an n-bit wide path. The links are serial links when the path is a single bit wide path (i.e., when n is equal to 1). Otherwise, the links are parallel links (i.e., when n is greater than 1). In the illustrated example, there is also a control path that traverses the memory devices 131-1, 131-2, 131-3, - - - , and 131-15. As part of this control path, the first memory device 131-1 has a command strobe input CSI and a corresponding command strobe output CSO. Similarly, each of the other memory devices 131-2, 131-3, - - - , and 131-15 has a command strobe input CSI and a corresponding command strobe output CSO. The command strobe input and output are for receiving and forwarding a command strobe signal transmitted by the memory controller 120 for enabling command input to the memory devices 131-1, 131-2, 131-3, - - - , and 131-15. Also, each of the devices has a data strobe input DSI and corresponding data strobe output DSO for transmitting a data strobe signal for enabling output from the memory devices 131-1, 131-2, 131-3, - - - , and 131-15 during read operation. Furthermore, each device has a clock input CLK for receiving a clock signal SCLK. In the particular example, the clock is fed to each of the devices in a common source clock fashion. Also, a reset signal /RST is proved to each of the devices by the memory controller 120. Additional interconnections may be provided for operation, for example, a chip select (not shown).

Although only 15 memory devices 131-1, 131-2, 131-3, - - - , and 131-15 are included in the illustrated example, more generally, there may be any appropriate number of memory devices interconnected in series with the memory controller 120.

In operation, the memory controller 120 sends commands over an output communication path established by link 121 and receives responses over an input communication path established by the link 122 for those commands that requisition a response. For each command, the memory controller 120 asserts the command strobe signal SCS1 for enabling the first device 131-1 to receive the command. Each of the memory device 131-1, 131-2, 131-3, - - - , and 131-15 has a unique device address (DA). In the illustrated example, the memory devices 131-1, 131-2, 131-3, - - - , and 131-15 have device addresses 0000, 0001, 0010, - - - , and 1110, respectively, but more generally the addresses are implementation specific. Each command issued from the memory controller 120 includes an ID number that matches the device address of a specific memory device (i.e., a selected or designated device). Whenever a memory device receives a command validated by the command strobe signal SCSi input to the command input Dn thereof, it determines whether the ID number (or DA) of the command matches its device address.

If there is a match, then the memory device executes the OP code identified by the OP code field of the command. The command format is shown in FIG. 2. Otherwise, the memory device does not execute the OP code identified by the OP code field of the command and merely forwards the command on to the next memory device.

Each of the memory devices 131-1, 131-2, 131-3, - - - , and 131-15 includes respective forwarding logic circuitry (not shown), which sets a state of the memory device that controls the forwarding of signals, such as those received on the command strobe input CSI and the command input Dn, to the next memory device, and respective control logic circuitry and memory (not shown), which controls the internal operation of the memory device's handling of commands and memory operations. A detailed example of forwarding logic and control logic circuitry and memory is described below with reference to FIGS. 4A, 4B and 4C.

If a memory device, for example, the second memory device 131-2, has been previously selected by the memory controller 120, i.e., the device address of a previous command matched the device address of the second memory device 131-2, when a subsequent command is asserted by the memory controller 120 and received by the second memory device, as indicated by the assertion of a command strobe signal SCSi, the second memory device 131-2 is first de-selected so that the subsequent command may be passed to the next memory device. If a selected memory device is not de-selected when the command strobe signal SCSi is asserted, the selected memory device will not pass the command strobe signal SCSi received at its command strobe input CSI, and the command received on its command input Dn, to the next memory device to which it is interconnected in series.

Each of the devices 131-1, 131-2, 131-3, - - -, and 131-15 shown in FIG. 3A includes forwarding logic circuitry, control circuitry and an array of memory cells. A general structure of the forwarding and logic circuitry will be described with reference to FIGS. 4A, 4B and 4C.

Figure 4A:
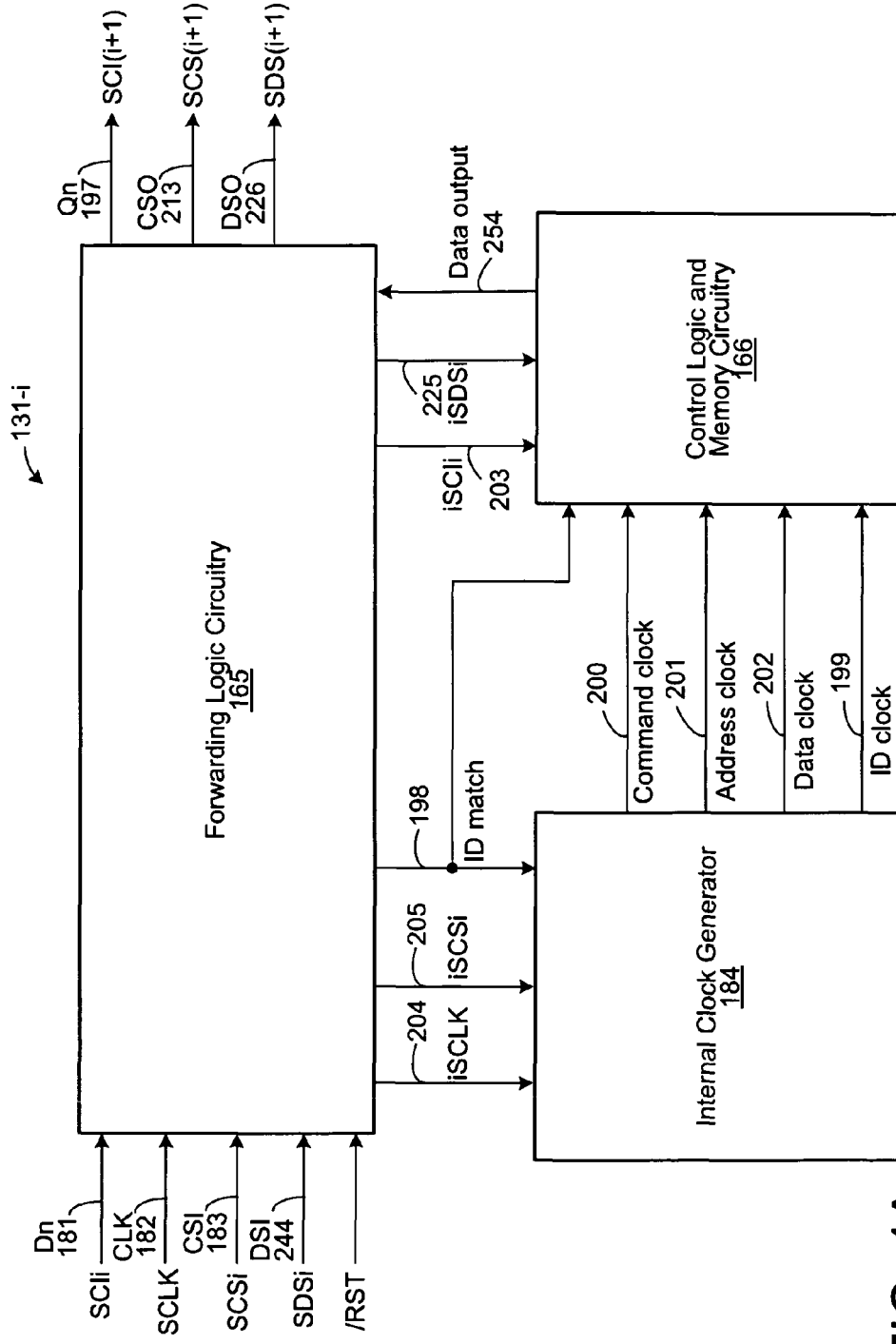
FIG. 4A is a schematic of example circuitry of a memory device shown in FIG. 3A.
Figure 4B:
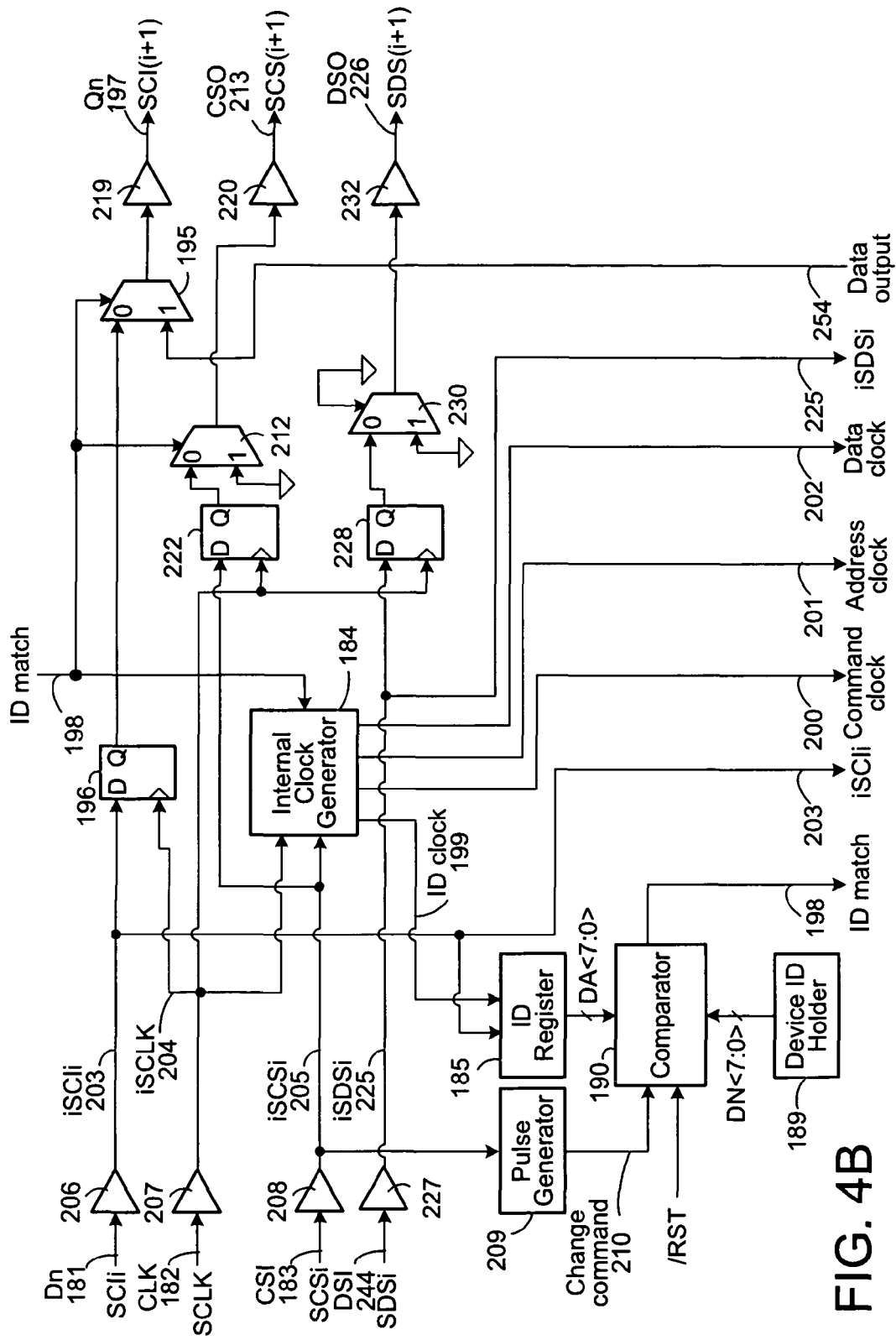
FIG. 4B is a schematic of an example of forwarding logic circuitry and an internal clock generator of the memory device shown in FIG. 4A.
Figure 4C:
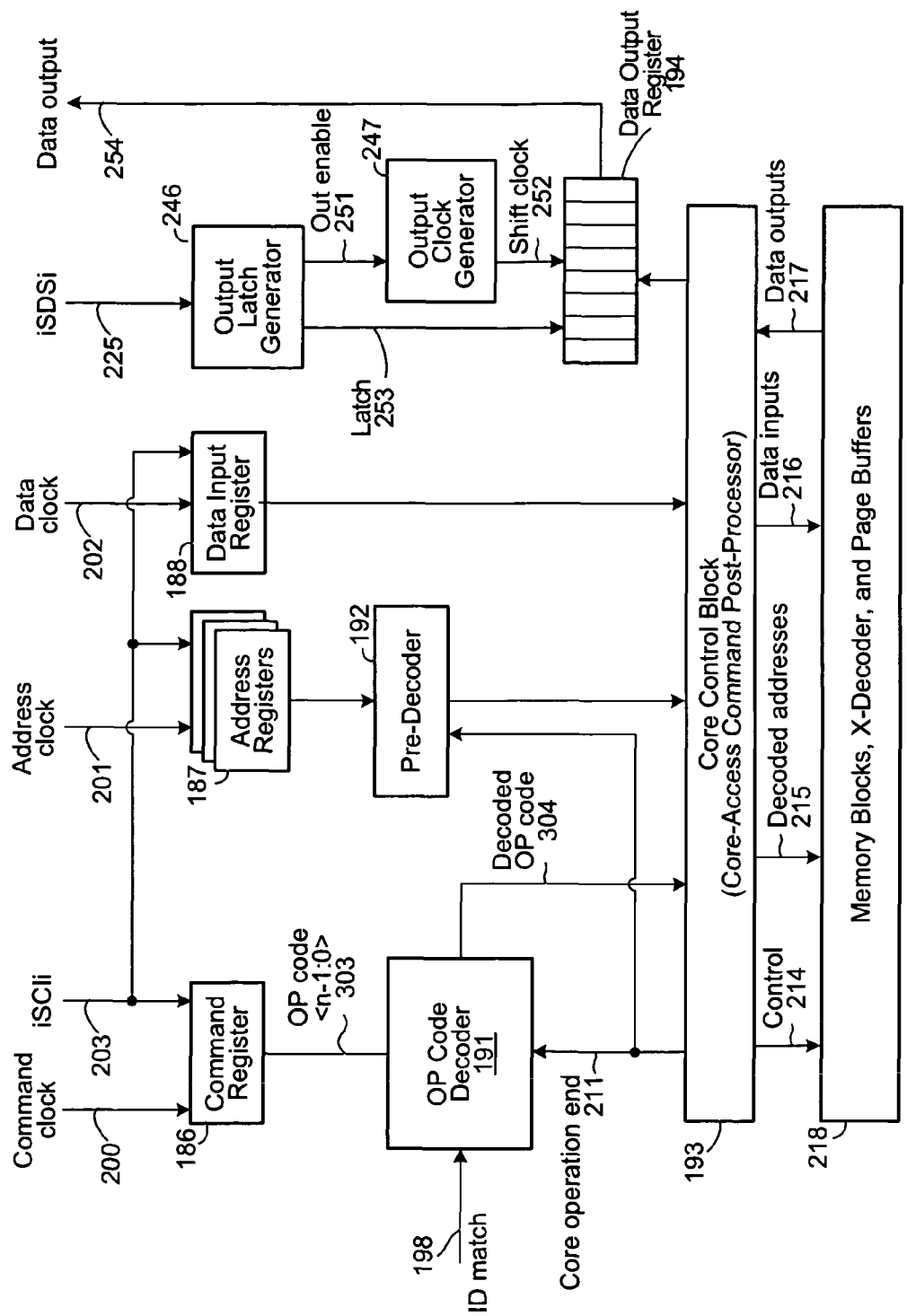
FIG. 4C is a schematic of an example of a control logic and memory circuitry of the memory device shown in FIG. 4A.

FIGS. 4A, 4B and 4C show example circuitry of one of the memory devices that are interconnected in series, with a memory controller or other memory devices via links as shown in FIG. 1 or 3A. It is to be understood that the example circuitry shown in FIGS. 4A, 4B and 4C is very specific and is provided for example purposes only.

Referring to FIGS. 3B and 4A, a representing memory device 131-$i$ includes forwarding logic circuitry 165, control logic and memory circuitry 166 and an internal clock generator 184. The forwarding logic circuitry 165 is circuitry for forwarding on inputs to outputs, and includes circuitry for determining whether or not to operate the control logic and memory circuitry 166, with reduced power consumption. The internal clock generator 184 produces various clock signals for operating the control logic and memory circuitry 166. However, it is to be understood that the division between the forwarding logic circuitry 165 and the control logic and memory circuitry 166 is rather arbitrary.

The memory device 131-$i$ includes four inputs: a command input (Dn) 181 for receiving incoming commands on the command input signal SCIi, a clock input (CLK) 182 for receiving the clock signal SCLK, a command strobe input (CSI) 183 for receiving the command strobe signal SCSi to enable command input, and a data strobe input (DSI) 244 for receiving the data strobe signal SDSi to output data. In FIG. 4A, these four inputs 181, 182, 183, 244 are inputs to the forwarding logic circuitry 165. The reset signal /RST is also provided to the forwarding logic circuitry 165.

The memory device 131-$i$ also includes three outputs: a command output (Qn) 197 for outputting the command input signal SCI(i+1), a command strobe output (CSO) 213 for outputting the command strobe signal SCS(i+1) and a data strobe output (DSO) 226 for outputting the data strobe signal SDS(i+1). In FIG. 4A, these three outputs 197, 213, 226 are outputs of the forwarding logic circuitry 165. The command input signal SCI(i+1), the command strobe signal SCS(i+1) and the data strobe signal SDS(i+1) from the present memory device 131-$i$ are transmitted to the next memory device 131-($l$+1).

The forwarding logic circuitry 165 provides an ID match signal 198, an internal clock signal "iSCLK" 204, and an internal command strobe signal "iSCSi" 205 to the internal clock generator 184. The forwarding logic circuitry 165 provides the ID match signal 198, an internal command input signal "iSCIi" 203, and an internal data strobe signal "iSDSi" 225 to the control logic and memory circuitry 166. The internal clock generator 184 provides a command clock signal 200, an address clock signal 201, a data clock signal 202 and an ID clock signal 199 to the control logic and memory circuitry 166. The control logic and memory circuitry 166 provides a data output signal 254 to the forwarding logic circuitry 165.

FIGS. 4B and 4C show detailed examples of very specific implementations of the forwarding logic circuitry 165 and control logic and memory circuitry 166 shown in FIG. 4A, respectively. FIGS. 4B and 4C are provided as examples only, and should not be considered to be limiting.

Referring to FIGS. 4A, 4B and 4C, in operation, a command contained in the command input signal SCIi is received over the command input Dn 181 with the command strobe signal SCSi asserted. The forwarding logic circuitry 165 detects the assertion of the command strobe signal SCSi and de-asserts the ID match signal 198, effectively placing the memory device 131-$i$ in a de-selected state. The command input signal SCIi and the command strobe signal SCSi are only passed on to the next memory device 131-($i$+1) as the command input signal SCI(i+1) and the command strobe signal SCS(i+1) if the present memory device 131-$i$ is in the de-selected state, i.e., the ID match signal 198 is not asserted. Effectively, de-asserting ID match signal 198 clears any previous selection of the device and allows the command input signal SCIi and the command strobe signal SCSi to be forwarded on to the next device 131-($i$+1) via its command output Qn 197 and the command strobe output CSO 213, respectively. The data strobe signal SDSi is passed on to the next memory device 131-($i$+1) via the data strobe output DSO 226, regardless of whether the current memory device is in a selected or de-selected state.

After de-asserting ID match signal 198, which places the memory device 131-$i$ in the de-selected state, the forwarding logic circuitry 165 compares the device address (DA) of the memory device 131-$i$ with the device ID that is included at the beginning of the command to determine whether there is a match therebetween. If there is a match between the DA and the ID, then the forwarding logic circuitry 165 asserts the ID match signal 198 in order to indicate an ID match and places the memory device 131-$i$ in a selected state. In the selected state, the command input signal SCI(i+1) from the command output Qn 197 and the command strobe signal SCS(i+1) from the command strobe output CSO 213 to the next device 131-($i$+1) are truncated, as it has been determined that the command is addressed to the present memory device 131-$i$. Therefore, the command and the command strobe do not need to be continued to be forwarded to the next downstream memory device. Otherwise, if there is no match between the DA and the ID, the comparator 190 does not assert the ID match signal 198, which maintains the memory device in the de-selected state. A delayed version of the command input signal SCIi and a delayed version of the command strobe signal SCSi continue to be forwarded to the next downstream memory device.

The forwarding logic circuitry 165 provides the internal command input signal iSCIi 203 derived from the command input signal SCIi, and the internal data strobe signal iSDSi 225 derived from the data strobe signal SDSi, to the control logic and memory circuitry 166. The forwarding logic circuitry 165 also produces the three clock signals: command clock signal 200, address clock signal 201 and data clock signal 202, which the control logic and memory circuitry 166 uses to interpret commands included in the internal command input signal iSCIi 203, to address data and to clock data into the memory block(s) of the memory device, respectively. The control logic and memory 166 produces its own internal output clock and clocks data out to the forwarding logic circuitry 165 as the data output signal 254.

In the forwarding logic circuitry 165, all four input signals thereto, namely the command input signal SCIi, the clock signal SCLK, the command strobe signal SCSi and the data strobe signal SDSi are buffered by input buffers 206, 207, 208 and 227, respectively. The command input signal SCIi is buffered to produce the internal command signal iSCIi 203 that is passed through a D-type flip-flop (D-FF) 196 onto a multiplexer 195, which produces an output that is buffered by an output buffer 219 to produce the command input signal SCI(i+1). Similarly, the command strobe signal SCSi and the data strobe signal SDSi are buffered to produce the internal command strobe signal iSCSi 205 and the internal data strobe signal iSDSI 225, which are passed through D-FFs 222 and 228 onto multiplexers 212 and 230, respectively. The multiplexers 212 and 230 provide outputs, which are buffered by output buffers 220 and 232, respectively, to produce the command strobe signal SCS(i+1) and the data strobe signal SDS(i+1), respectively.

The command input signal SCI(i+1), the command strobe signal SCS(i+1) and the data strobe signal SDS(i+1) are fed to the corresponding command input Dn, command strobe input CSI and data strobe input DSI of the next memory device 131-(i+1), respectively. The D-FFs 196, 222, 228 are for delaying the respective signals SCIi, SCLK, SDSi in response to the clock signal SCLK and thus, the delay by each D-FF is related to clock cycle latency.

The internal command input signal iSCIi 203 is fed to an ID register 185 and is also passed to the control logic and memory circuitry 166. The clock signal SCLK is buffered by buffer 207 to produce the internal clock signal iSCLK 204. The internal clock signal iSCLK 204 and the internal command strobe signal iSCSi 205 are fed to the internal clock generator 184, which outputs the ID clock signal 199, command clock signal 200, address clock signal 201 and data clock signal 202. The ID clock signal 199 is fed to the ID register 185. The command clock signal 200, the address clock signal 201 and the data clock signal 202 are passed to the control logic and memory circuitry 166. The internal clock signal iCLK 204 is also fed to the D-FFs 196, 222, 228. The internal command strobe signal iSCSi 205 is fed to a pulse generator 209 that produces a change command signal 210 having pulses generated by the pulse generator 209, which is fed to a first input of the comparator 190. The comparator 190 also has a second input from the ID register 185 and a third input from a device ID holder 189 (that is a storage element: e.g., a register) containing a device ID, which represents the actual device address (DA) of the present memory device 131-i. The comparator 190 outputs the ID match signal 198.

The ID match signal 198 from the comparator 190 is provided to the internal clock generator 184 as well as to control inputs of the multiplexers 195, 212 to control selection of those multiplexers. The third multiplexer 230 has a control input that is connected to a static low voltage Vss, such that the output of the D-FF 228 is selected and passed to the output buffer 232 to produce the data strobe signal SDS(i+1) from its data strobe output DSO 226. The multiplexers 195, 212, 230 shown in FIG. 4B are all 2 to 1 multiplexers, each having a first input "0" connected to the output of one of the D-FFs 196, 222, 228, respectively. The multiplexers 212, 230 have second input "1" that are connected to static voltages, for example, Vss, while the multiplexer 195 has a second input "1" that is connected to the data output signal 254 of the control logic and memory circuitry 166.

In the control logic and memory circuitry 166 shown in FIG. 4C, the internal command input signal iSCIi 203 is fed to a command register 186, address registers 187, and a data input register 188. The command clock signal 200, address clock signal 201 and data clock signal 202 from the internal clock generator 184 are fed to the command register 186, the address registers 187, and the data input register 188, respectively. The ID match signal 198 from the comparator 190 is provided to an OP code decoder 191. The OP code decoder 191 has an input for receiving an OP code signal 303 of n bits <n−1:0> from the command register 186. The address registers 187 are connected to a pre-decoder 192. The OP code decoder 191, the pre-decoder 192, and the data input register 188 have outputs connected to a core control block 193. The OP code decoder 191 and the pre-decoder also have inputs for receiving a core operation end signal 211 from the core control block 193.

The core control block 193 is connected to memory blocks 218 and a data output register 194. Examples of signals that are communicated between the core control block 193 and the memory blocks 218 include a control signal 214, an address signal of decoded x and y addresses 215, a data input signal 216 to the memory blocks 218 and a data output signal 217 from the memory blocks 218. The internal data strobe signal iSDSi 225 from the forwarding logic circuitry 165 is provided to an output latch generator 246, which provides a latch signal 253 to the data output register 194, and an output enable signal 251 to an output clock generator 247. The output clock generator 247 outputs a shift clock signal 252 that is provided to the data output register 194.

Referring to FIGS. 4B and 4C, in operation, a command is received on the command input signal SCIi with the command strobe signal SCSi asserted. The pulse generator 209 detects the assertion of the command strobe signal SCSi and the change command signal 210 is generated. The change command signal 210 causes the comparator 190 to de-assert the ID match signal 198, effectively de-selecting the present memory device 131-i and placing it in a de-selected state. The purpose of this is to clear the results of the previous comparison result, so that command input signal SCIi 181 and the command strobe signal SCSi 183 can start to be forwarded on to the next device. Otherwise, the previous ID match results would not be reset until the comparator's operation is complete, and by that time, some of the relevant contents of the command input signal SCIi and the command strobe signal SCSi would already have been dropped by the multiplexers 195, 212, respectively.

The internal clock generator 184 generates the ID clock signal 199 for the ID register 185. As described with reference to FIG. 2, the command starts with an ID number, which is loaded into the ID register 185.

After de-asserting ID match signal 198, which places the memory device 131-i in the de-selected state, the comparator 190 compares the contents (i.e., the ID number) of the ID register 185 with the device ID stored in the device ID holder 189. If there is a match between them, then the comparator 190 asserts ID match signal 198 in order to indicate an ID match and place the memory device in a selected state. In the selected state, the command input signal SCI(i+1) and the command strobe signal SCS(i+1) to the next memory device 131-(i+1) are truncated, as it has been determined that the command is addressed to the memory device, and therefore the command and the command strobe do not need to be continued to be forwarded to the next downstream memory device. Otherwise, if the ID number does not match the device address of the memory device, the comparator 190 does not assert ID match signal 198, which maintains the memory device in the de-selected state, and a delayed version of the command input signal derived from the command input signal SCIi 181 and a delayed version of the command strobe signal derived from the command strobe signal SCSi 183 continue to be forwarded to the next downstream memory device via its command output Qn 197 and the command strobe output CSO 213.

A command code in the internal command input signal iSCIi 203 is loaded into the command register 186 when the command clock signal 200 is enabled for the particular device, i.e., when the command containing an ID that matched that of the particular device. The contents of the command register 186 are provided to the OP code decoder 191 as the OP code signal 303 of n bits <n−1:0>. If the ID match signal 198 is high, then the OP code decoder 191 decodes the n-bit contents of the OP code signal 303. The OP code decoder 191 outputs a decoded OP code signal 304, which is a decoded version of the OP code. However, if the ID match signal 198 is low, then the OP code decoder 191 does not decode the OP code of the OP code signal 303. The decoded OP code is implementation specific and may for example include any one or more appropriate signals for execution of the OP code.

The ID match signal 198 is used to initiate OP code decoding. The ID match signal 198 is not always high. Rather, the ID match signal 198 is high only at the target (or designated) memory device in the series interconnected devices. Invalid glitch logic generation from decoding logic is avoided since the OP code decoder 191 takes the ID match signal 198. The ID match signal 198 can control the result of the OP code decoder 191. Using this logic, when the ID match signal 198 is low, current generation, after the OP code decoder 191, can be reduced and therefore reduced power consumption can be realized.

In some examples, only the forwarding of the delayed version of the command input signal SCIi 181 is truncated once the memory device is placed in the selected state, i.e., once the ID match signal 198 is asserted.

In the example shown in FIGS. 4B and 4C, the ID match signal 198 is active high. Alternatively, the ID match signal 198 may be active low. The ID match signal 198 has a role in activating the internal clock generator 184 and the OP code decoder 191, and in selecting the output of the multiplexers 195, 212. Specifically, while the ID match signal 198 is not asserted, i.e., the memory device 131-i is in a de-selected state, the delayed output of the D-FF 196, which is equal to the internal command data signal iSCIi 203 delayed by approximately one clock cycle, is passed by the multiplexer 195 to the output Qn 197. The internal command strobe signal iSCSi, which is a buffered and delayed version of the command input signal SCSi, is provided by the D-FF 222 is passed as the command strobe signal SCS(i+1) to the internal CSO output 213 by the multiplexer 212.

Otherwise, when the ID match signal 198 is asserted, the output of the data output register 194 is passed as the command input signal SCI(i+1) held at a static level, which in the illustrated example is active low, i.e. ground. In some embodiments, when the memory device is in the selected state, the command input signal SCI(i+1) may continue to be provided, or, in other implementations, may be connected to any static reference voltage.

The comparator 190 first de-asserts the ID match signal 198 when a new command is detected by detecting an assertion of the command strobe signal SCSi in order to allow the beginning of the new command and the assertion of the command strobe signal SCSi to be passed to the next memory device 131-(i+1) through the outputs Qn 197 and CSO 213, respectively, while the comparator 190 operates on the ID number contained in the new command. If the ID match signal 198 is not de-asserted, the multiplexers 195, 212 will not pass the new command and the command strobe signal SCSI to the outputs 197, 213 in the event the particular memory device had been selected in a previous command. In this way, the command strobe signal SCSi affects the selection and de-selection of the memory device.

The internal clock generator 184 generates a command clock signal 200 for the command register 186, an address clock signal 201 for the address register 187, and a data clock signal 202 for the data input register 188 if ID match signal 198 is high. Therefore, the command code, additional addresses, and data of the command are conditionally loaded into the registers 186, 187, 188 for further processing by the OP code decoder 191, pre-decoder 192, core control block 193. In the event that there is no ID match, then the internal clock generator 184 does not generate the command clock signal 200, address clock signal 201, and data clock signal 202, because there is no need for the memory device to load the command, additional addresses, and the data from the command. When ID match signal 198 is low, internal operations are halted (by not generating the clocks) so that unnecessary power consumption can be avoided. For instance, the OP code decoder 191 does not operate and the core control block 193 does not activate memory operations. Bank control and other logic blocks placed after the OP code decoder 191 are controlled by results of the OP code decoder 191. This can result in power savings. Holding a high or low state in CMOS logic results in low power consumption, as leak current is very low.

Effectively, de-selection of the memory device is accomplished by de-asserting the ID match signal 198 when the command strobe signal SCSi is asserted, and selection of the memory device is performed by first de-selecting the device if it is currently selected when the command strobe signal SCSi is asserted, matching a device address contained in the command input signal SCIi 181 with the device address stored in the device ID holder 189 and asserting the ID match signal 198. Depending on the type of command currently being carried out by a selected memory device, de-selection of the selected device upon receipt of a next command may occur in one of two ways, as explained below.

For peripheral register access operations and page buffer access operations, assertion of the command strobe signal SCSi directly affects the de-selection of the device and the further operation of the device is determined by the new command inputs, i.e. the device is immediately de-selected, the comparator checks the device address in the new command inputs and if there is a match, the ID match signal 198 is asserted and the commands are executed.

In the case of a core access operation, such as page read, page program, and block erase, which take a relatively long time internally to carry out, the present operation status of the memory device that is carrying out one of these core access operations is held without interrupting the current operation while the input and output ports of the memory device are available to receive and transmit the next command input and command strobe input. To satisfy this kind of operation, the core operation end output 211 from the core control block 193 is used to let the OP code decoder 191, and potentially other operational blocks of the memory device know that the core access operation has completed.

As noted above, a data strobe signal may be used in some examples to enable transfers of data from a plurality of series interconnected memory devices during read operations.

To overwrite incoming link data with memory or register read data, a memory device is first selected with a data read command, such as "burst data read". Only one device on the link can be primed, i.e. selected, at any time. FIGS. 4B and 4C show a Read Data command flowing through a memory device with a flow-through latency of 1 cycle. In some embodiments, when the primed device samples a 0 to 1 transition (or a 1 to 0 transition in some embodiments) on the data strobe signal SDSI at the rising edge of the clock signal SCLK, it overwrites the incoming data of the command input signal SCIi with the registered read data in the data output signal 254 from the control logic and memory circuitry 166 and outputs this as the command input signal SCI(i+1) to the next memory device. The data burst continues as long as the data strobe signal SDSI remains high. The next rising edge of the command strobe signal SCSi de-selects the device.

In the case of an unselected device, i.e., the ID match signal 198 is low and the device does not provide data to the data path through the series-connected memory devices. The unselected device does not know whether the data flowing through it is null data from the controller or live data from an upstream memory device on its way to the controller, in the case of a ring configuration. Both the data and the data strobe pulse are replicated unchanged as they flow from the input to the output of each unselected memory device. The length of the data strobe pulse indicates the amount of data that is being transferred from a memory to the controller. The length of a data strobe pulse exactly coincides with the amount of time needed to transfer an integral number of bytes given the actual data channel width n (n=1 for a serial link, and n>1 for a parallel link).

The circuitry shown in FIGS. 4A, 4B and 4C functions to, on the one hand, forward on the command input signal SCIi as the command input signal SCI(i+1) when a command is received that is not addressed to that device. The circuitry functions, on the other hand, to connect the output 197 to the data output register 194, both upon receipt of a command that is addressed to that device so as to prevent the command from being forwarded to the next device and to allow outputs from that device to be produced as the command input signal SCI(i+1).

The internal command input signal iSCIi 203 is fed through the D-FF 196 to the multiplexer 195. The multiplexer 195 determines whether the command input signal SCI(i+1) is to be provided from the command input signal SCIi 181 or by the output of the data output register 194. The multiplexer 195 selects between the buffered and delayed version of the command input signal SCIi that is provided by the D-FF 196 and the output of the data output register 194 based on whether the ID match signal 198 is high. The ID match signal 198 is high when the memory device has been selected and low when the memory device is unselected. In the illustrated example, the ID match signal 198 is determined by the comparator 190. When the memory device receives the command with the ID number that matches its device address, then ID match signal 198 is asserted high and the multiplexer 195 is switched to select the data output signal 254 of the data output register 194. The ID match signal 198 is low, then the command input signal SCI(i+1) is provided from the buffered and delayed version of the command input signal SCIi 181 provided by the D-FF 196.

The buffered and delayed version of the command input signal SCIi is forwarded on as the command input signal SCI(i+1) to the next device for a brief period of time that is determined by the internal logic combination, (in this case, a time period equal to a number of cycles necessary to clock in the device ID) and after that the input is truncated, and a fixed output value from the data output register 194 is transmitted as the command input signal SCI(i+1). The output command input signal SCI(i+1) is static because no output of data output register 194 is produced (i.e., clocked out) until the shift clock signal 252 is generated by output clock generator 247, and this is not done until the data output register 194 output the output enable signal 251 is asserted by the output latch generator 246 as a result of the assertion of the data strobe signal SDSI. The output latch generator 246 also produces the latch signal 253 that causes data from the core control block 193 to be latched into the data output register 194 so that it can be provided as the command input signal SCI(i+1).

The switching operation of the multiplexer 195 allows subsequent (downstream) devices to receive a static level in the event that the memory device has been selected. Therefore, subsequent devices take a static value and no transitions occur at their input and output buffers. However, note that if the command contains an OP code that is a read OP code requisitioning a response, then read data is clocked out of the data output register 194 and provided as the command input signal SCI(i+1) while the data strobe signal SDSi is being asserted.

If the memory device 131-*i* is selected, i.e. ID match signal 198 is high, for a read data command, the null data placed in the packet by the controller is replaced by read data from the device. For example, for a ring configuration, the selected device may have previously executed a read data transfer command which instructed the memory block(s) of the device to transfer either memory data or register contents back to the controller in the next Read Data to flow around the ring. After the read data transfer command is received by the memory device, the memory device is selected for the read data transfer and that transfer will commence upon the next rising edge of the data strobe signal SDSi. The transfer begins with the rising edge of the data strobe signal SDSi as it flows through the memory device. The data transfer continues until the data strobe signal SDSi is de-asserted. The contents of the Read Data streams, as it leaves the selected device are determined by the semantics of the command that selected the device for the data transfer. Although the null data that the controller places in the Read Data streams as it leaves the controller is arbitrary, in some embodiments, the controller transmits 0s or 1s to minimize power consumption.

A memory device becomes selected for a data transfer when it successfully decodes a data transfer command. At that point it is enabled to replace null data with read data on the next and all subsequent Read Data streams on the next rising edge of the clock signal SCLK on which the command strobe signal SCSi is sampled high. This allows the memory controller to break up a long contiguous transfer across multiple Read Data streams. A selecting Read Transfer Command and all of its subsequent Read Data streams constitute a single transaction. If the memory controller wishes to interrupt a long Read Packet to issue commands to other memory devices or banks in the selected device, it may do so, but the Read Transfer Command associated with the interrupted Read Data stream may have to be re-issued prior to resuming the interrupted Read Data streams. Also, if the memory controller issues a command strobe and a command addressed to another device between a read-priming command and its associated Read Data streams, the device that is selected for read will become de-selected. On the other hand, the memory controller may interrupt a Read Data stream at any time during its progress and then resume it at a later time without having to re-issue its associated Read Transfer Command provided that no other commands to any device or bank are issued while the Read Data stream has been interrupted. In the event of a valid Read Data streams command, whether subsequent Read Data streams are a continuation of the previous one, or a repeat of data already sent is dependent on the semantics of the selecting data transfer command.

While the examples shown in FIGS. 4A, 4B and 4C include a command input signal SCIi, more generally, embodiments may include a command input with any data width, i.e. the command input Dn may be a parallel or a serial link. For a parallel link between series connected memory devices, the circuitry of each memory device may include a D-FF, such as the D-FF 196, a multiplexer, such as the multiplexer 195 and an output buffer, such as the output buffer 219, for each data line of the parallel link.

Although examples presented herein use multiplexers for the selection of the outputs 197, 213, more generally, any data path selector can be implemented.

Figure 5:
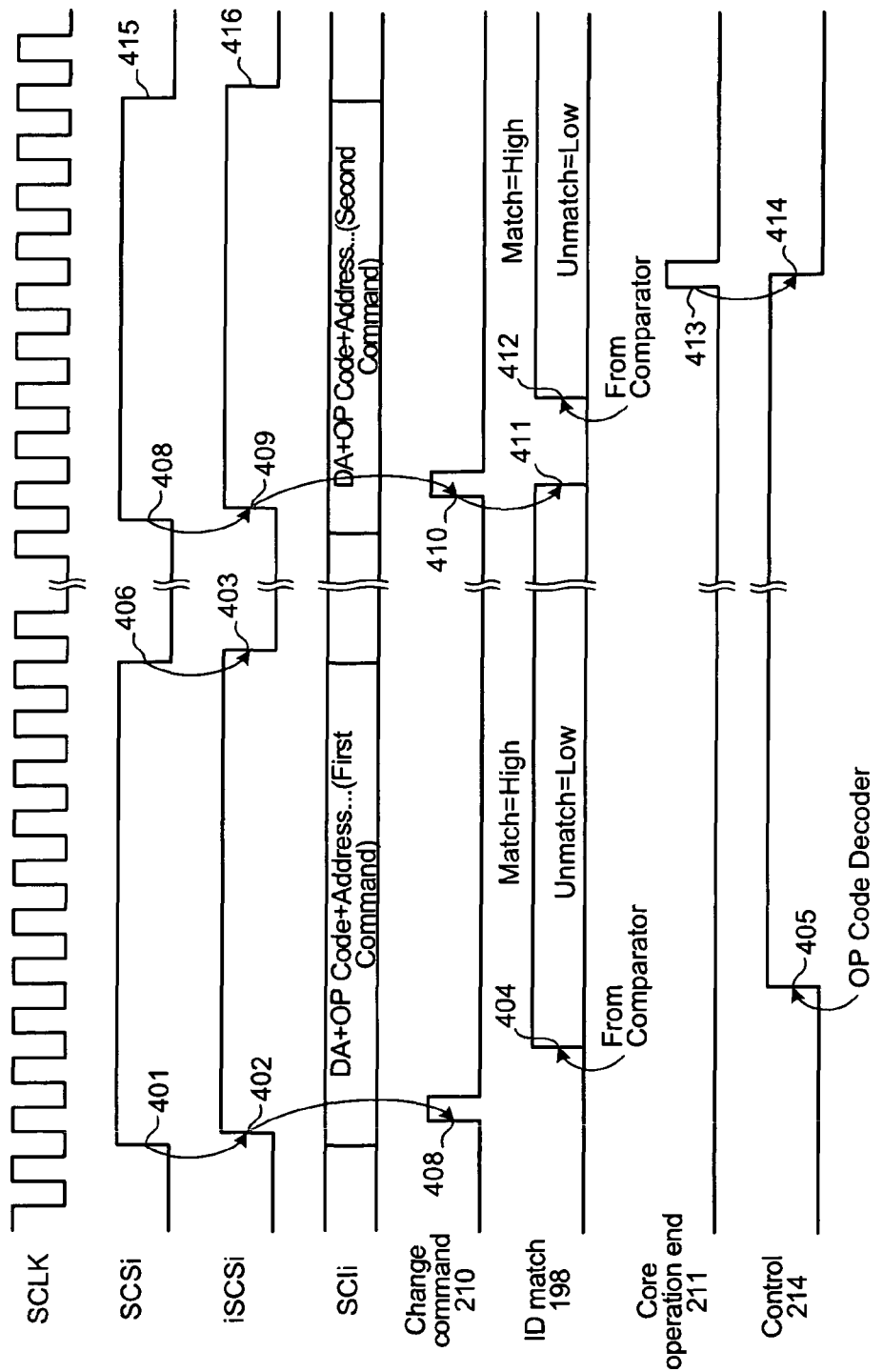
FIG. 5 is a signaling diagram for example signals in the circuitry shown in FIGS. 4B and 4C.

Example signals that may be generated by and for the memory device 131-*i* shown in FIGS. 4B and 4C are provided in FIG. 5. Referring to FIG. 5, shown is a signaling diagram for example signals that may be generated by and for the forwarding logic circuitry 165 and the control logic and memory circuitry 166 of the memory device 131-*i* shown in FIGS. 4A, 4B and 4C. The signaling diagram includes the clock signal SCLK, the command strobe signal SCSi, the internal command strobe signal iSCSi that is generated based on the command strobe signal SCSi, the command input signal SCIi, the change command signal 210 produced by the pulse generator 209, the ID match signal 198 produced by the comparator 190, and the core operation end output signal 211 and control signals 214 produced by the core control block 193. The command strobe signal SCSi is asserted high at 401 at the same time that a first command is received in the command input signal SCIi.

In the illustrated example, the first command contains a device address, an operational (OP) code and other information associated with the OP code, such as an address. After a delay resulting from buffering the command strobe signal SCSi, the internal command strobe signal iSCSi is asserted high at 402, which causes the change command signal 210 to be asserted high at 408 for half a clock cycle of the clock signal SCLK. When the change command signal 210 is asserted at 408, the ID match signal 198 is low, indicating that the memory device is not selected, and therefore the assertion of the change command signal 210 does not cause a transition in the ID match signal 198. Following the reception of the device address in the first command, and the comparison of the received device ID and the device address (DA) of the memory device by the comparator 190, the comparator 190 asserts the ID match signal 198 high" at 404 if there is a match between them. Otherwise, the ID match signal 198 is maintained low.

If the device address of the memory device matches that of the first command, and the ID match signal 198 is asserted high at 404, and if the OP code of the first command includes a core operation, then following the interpretation of the OP code by the OP code decoder 191, and the post-processing of the core-access command by the core-access command post-processor of the core control block 193, the control signals 214 are asserted at 405.

At the end of the first command, the command strobe signal SCSi is de-asserted at 406, and after a buffering delay, the internal command strobe signal iSCSi is de-asserted at 403. The ID match signal 198 is maintained either high (matched, selected state) or low (unmatched, de-selected state), until the command strobe signal SCSi is asserted high again at 408, signaling a second command on the command input signal SCIi. Once again, after a buffer delay, the internal command strobe signal iSCSi is asserted high at 409, which causes the change command signal 210 to be asserted high at 410. The assertion of the change command signal 210 at 410 causes the ID match signal 198 to be de-asserted at 411, placing the memory device in a de-selected state. Specifically, if the ID match signal 198 was asserted high for the first command, i.e., the device address of the memory device matched the device address in the first command, then assertion of the change command signal 210 at 410 causes the ID match signal 198 to be de-asserted. Otherwise, if the ID match signal 198 was already low, i.e., de-asserted, then it simply remains de-asserted. Following the de-assertion of the ID match signal 198 at 411, the comparator 190 compares the device address in the second command received in the command input signal SCIi to the device address stored in the device ID holder 189, and asserts the ID match signal 198 high at 412 if a match is found. Otherwise, the ID match signal 198 remains de-asserted, and the memory device remains in a de-selected state.

The assertion of the control signals 214 at 405 resulting from the assertion of the ID match signal 198 at 404 and the assertion of interpreted command codes (not shown) from the OP code decoder 191 for the first command is maintained until the core control block 193 indicates that the core operation has been completed by asserting the core operation end output 211 high at 413 for a half a clock cycle and the control signals 214 are de-asserted at 414. At the end of the second command, the command strobe signal SCSi is de-asserted at 415, and after a buffering delay, the internal command strobe signal iSCSi 205 is de-asserted at 416.

By de-asserting the ID match signal 198 at 411 and maintaining the control signals 214 until the core operation end output signal 211 is asserted to indicate that the core operation started by the first command has been completed, a core operation started at 405 may be carried out while the link forwarding 165 simultaneously passes some or all of the second command and the command strobe signal SCSi to a next device of the series-connected memory devices via the outputs 197, 213, respectively while the ID match signal 198 is de-asserted at 411. Of course, if a match is found and the ID match signal 198 is asserted at 412, i.e., the second command is addressed to the present memory device, the propagation of the command input signal SCIi and the command strobe signal SCSi to the next memory device via the outputs 197, 213 is truncated once the ID match signal 198 is asserted at 412 in order to save power, while observing a condition that all inputs are an integral number of bytes long. This truncation is accomplished by lowering the command strobe signal SCS (i+1) and by discontinuing the echoing of the command input signal SCIi onto the command input signal SCI(i+1). Typically, this would truncate the Command and Write Data Packet to one or two bytes in length.

Note that the command strobe signal SCSi is asserted for the same amount of time that the command data associated with each command is asserted in the embodiment shown in FIG. 5. That is, the command strobe signal SCSi is asserted for exactly long enough to transmit the command, the address (if any), and the data (if any). The length of the command may vary depending on the type of command issued, as illustrated by the different lengths of the commands illustrated in FIG. 2, whether or not data is issued, and if so, how much data is issued. For Command and input data that includes write data, the length of time that the command strobe signal SCSi is asserted, and not the command per se, determines the amount of write data that is included in the command input signal SCIi. The command strobe signal SCSi is typically asserted for exactly enough time to indicate the transfer of an integral number of bytes for the current actual channel width (i.e., n number, where n=1 for serial and n>1 for parallel channel widths).

FIG. 6A shows example signals in the circuitry shown in FIGS. 4B and 4C. Referring to FIGS. 4A, 4B and 6A, example signals are generated by the circuitry shown in FIGS. 4B and 4C where it is assumed a command has been received that contains an ID that matches that of the particular device. The signaling diagram includes the command strobe signal SCSi, the ID match signal 198, the OP code signal 303 of n-bits <n−1:0>, and the decoded OP code signal 304. In this example, it is assumed that there is an ID match and therefore, the ID match signal 198 is asserted. This causes the OP code signal 303 from the command register 186 to be decoded so as to generate the decoded OP code signal 304.

FIG. 6B shows other example signals in the circuitry shown in FIGS. 4B and 4C. Referring to FIGS. 4B, 4C and 6B, example signals that are generated by the circuitry shown in FIGS. 4B and 4C where it is assumed a command has been received that contains an ID that does not match that of the particular device. The signaling diagram includes the command strobe signal SCSi, the ID match signal 198, the OP code signal 303, and the decoded OP code signal 304. In this example, it is assumed that there is no ID match between the ID number contained in the command and the DA of the device. Therefore, the ID match signal 198 is not asserted and no command clock signal 200 is produced by the internal clock generator 184. Accordingly, the OP code is not loaded into the command register 186, with the result that no OP code signal 303 is output. The OP code is, thus, an unknown value. The decoded OP code signal 304 is low because the OP code decoder 191 does not decode OP codes.

Figure 7:
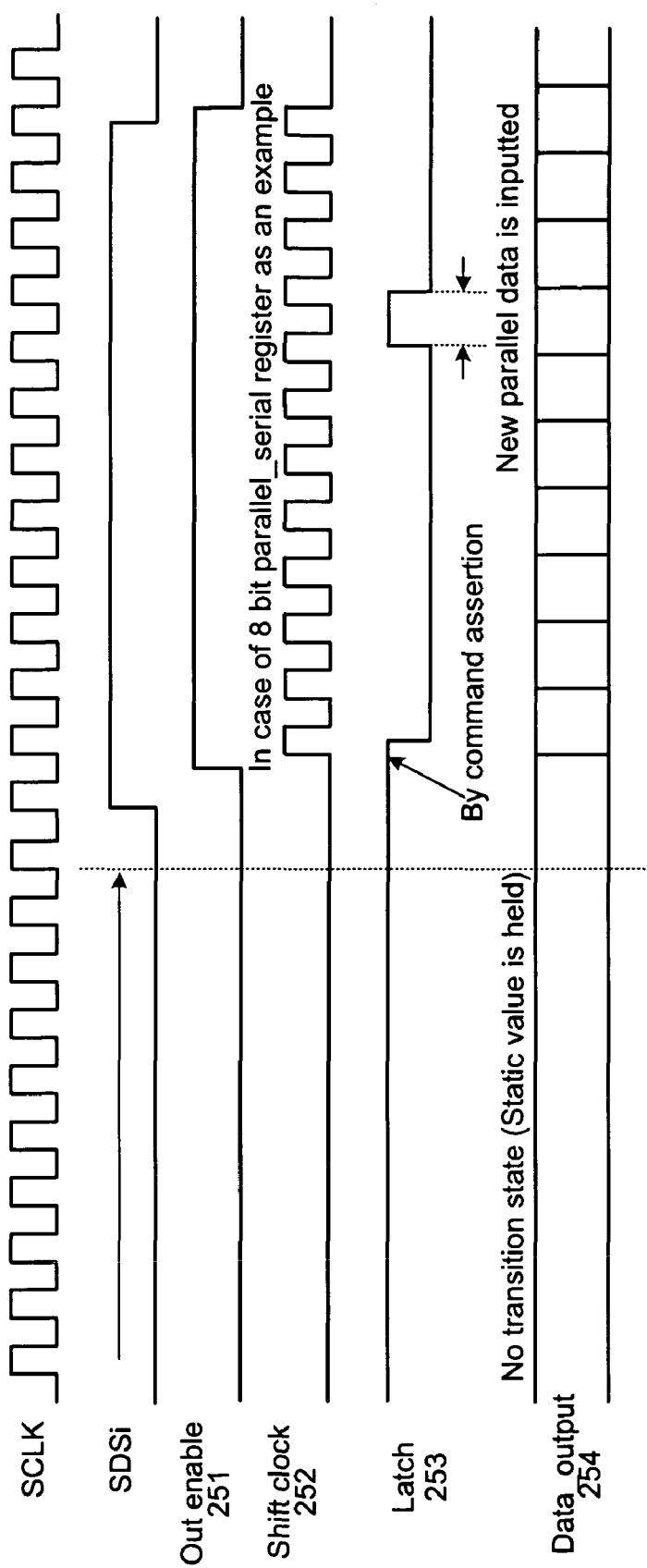
FIG. 7 is a signaling diagram of example signals in the circuitry shown in FIGS. 4B and 4C.

Generation of the data output signal 254 from the data output register 194 will now be described with reference to FIG. 7. FIG. 7 shows a signaling diagram of example signals that may be generated by the memory device 131-$i$ shown in FIGS. 4A, 4B and 4C.

Referring to FIGS. 4A-4C and 7, the signaling diagram includes the clock signal SCLK, the data strobe signal SDSi, the output enable signal 251, the shift clock signal 252, the latch signal 253, and the data output signal 254. Operation starts when the data strobe signal SDSi is asserted. In response to the assertion of the internal data strobe signal iSDSi 225), the output latch generator 246 generates the latch signal 253 to instruct the data output register 194 to latch contents read from the core control block 193. The output latch generator 246 also generates the output enable signal 251 to enable the output clock generator 247. The output clock generator 247 generates the shift clock signal 252 when the output enable signal 251 is asserted high. The shift clock signal 252 is used to clock the data output signal 254 out of the data output register 194. Accordingly, the data output signal 254 from the data output register 194 is provided to the multiplexer 195.

For write operations with long command input, this works with the same effect. No matter what OP code is input with the ID number, if the ID number is matched with that of the device, ID match signal 198 is asserted and then the fixed level of data output signal 254 is transmitted to the next device as the command input signal SCI(i+1). After the selection of a device, unselected devices can save power consumption even at the input and output buffers.

In the illustrated example, truncation of data may be performed between the command input signal SCIi to the device 131-$i$ and the command input signal SCI(i+1) to the next device 131-($i$+1). Truncation of the command strobe can also be performed, but it does not affect the total power saving because the command strobe has two transitions (low to high and high to low) no matter what length of data is asserted. Note that a static value is taken from the Vss as shown in FIG. 4B for truncating the command strobe. With a read operation of data of the data output register 194, the contents from the register 194 are clocked out and sent over the command input signal SCI($i$+1) to the next device 131-($i$+1). Therefore, taking the static value from the register 194 during a write operation makes use of an existing data path. However, it is to be understood that a static value can be taken from any source that can provide a static value. The static value may for example be taken directly from a supply ground. Other implementations are possible.

The comparator 190 shown in FIG. 4B contains appropriate circuitry for implementing the functionality described above. Example circuitry is described below with reference to FIGS. 8 and 9.

Figure 8:
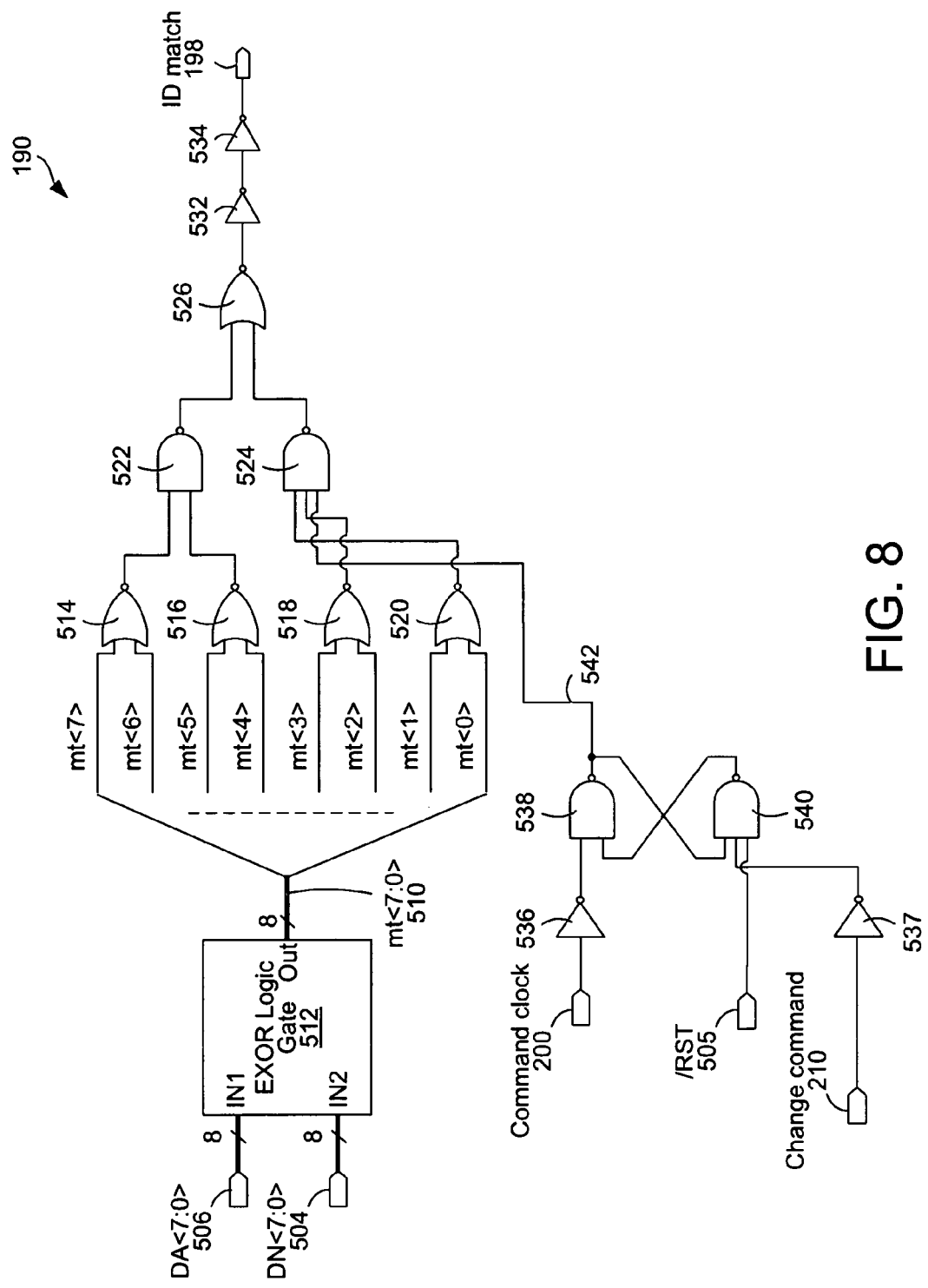
FIG. 8 is a circuit diagram of another example of the comparator shown in FIG. 4B.

FIG. 8 shows an example of the comparator 190 shown in FIG. 4B for single data rate (SDR) operation.

Referring to FIGS. 4B, 4C and 8, a comparator 190 includes an exclusive OR (EXOR) logic gate 512 having two 8-bit inputs "IN1" and "IN2". In the particular example, the device address DA 506 is 8 bits long <7:0>. More generally, the device address may be of any length that allows a number of memory devices interconnected in series to be uniquely addressed. The input "IN1" of the EXOR logic gate 512 receives the 8-bit wide DA<7:0> 506, which is stored in and provided by the device ID holder 189. The input "IN2" of the EXOR logic gate 512 receives the 8-bit wide ID number DN<7:0> from the ID register 185 wherein the ID number contained in the command input signal SCIi is loaded. The EXOR logic gate 512 produces a match output signal 510 of 8 bits mt<7:0>.

The comparator 190 also includes combinatorial logic circuitry that combines the 8-bits mt<7:0> of the match output signal 510 to produce the ID match signal 198, such that the ID match signal 198 is asserted if each bit of the 8-bit match output signal 510 indicates a match, and de-asserted if at least one bit of the 8-bit match output signal 510 does not indicate a match.

In the particular example shown in FIG. 8, the combinatorial logic circuitry includes an alternating cascade of NOR and NAND gates that combine the 8 signals of the 8-bit match output signal 510 and an output command finish signal 542 of a latch to produce the ID match signal 198. The latch in FIG. 8 is implemented with a two-input NAND gate 538, and a three-input NAND gate 540 that are cross-coupled, i.e. the output of NAND gate 538 is connected to an input of NAND gate 540, and the output of NAND gate 540 is connected to an input of NAND gate 538. In FIG. 8, the alternating cascade of NOR and NAND gates includes four two-input NOR gates 514, 516, 518, 520, and the inputs of the four two-input NOR gates are respectively connected to one of the output data lines of the 8-bit wide output match signal mt<7:0> 510 of the EXOR logic gate 512. Outputs of the first two NOR gates 514, 516 are connected to a two-input NAND gate 522, which has an output connected to one input of a two-input NOR gate 526. Outputs of the second two NOR gates 518, 520 are connected to two inputs of a three-input NAND gate 524. An output of the three-input NAND gate 524 is connected to the second input of the NOR gate 526.

The command clock signal 200 is fed to an inverter 536, the output of which is connected to a first input of the two-input NAND gate 538. An active low reset signal /RST 505 is fed to a first input of the three-input NAND gate 540 and the change command signal 210 is fed to the input of an inverter 537. The output of the inverter 537 is connected to a second input of the three-input NAND gate 540. As noted above, the second input of the NAND gate 538 and the output of the NAND gate 540, and the third input of the NAND gate 540 and the output of the NAND gate 538 are connected to form the latch. The output command finish signal 542 of the latch is taken from the output of the NAND gate 538, which is connected to the third input of the three-input NAND gate 524. The output of the NOR gate 526 is connected to an inverter 532, the output of which is connected to an inverter 534 to produce the ID match signal 198.

In operation, the EXOR logic gate 512 compares the device address represented by DA<7:0> on a bit-width basis with the ID number DN<7:0>, and if each bit of the device addresses match, then the match output signal "mt<7:0>" of the EXOR logic gate 512 will be a logic "low". Otherwise, if the device addresses do not match, one or more of the bits of the match output signal "mt<7:0>" will be a logic "high".

The inverters 536, 537 and the latch connection of the NAND gates 538, 540 produce the output command finish signal 542 that is a logic "high" unless the reset signal /RST 505 is asserted low or the change command signal 210 is asserted high.

The arrangement of the NOR gates 514, 516, 518, 520, 526 and the NAND gates 522, 524 ensures that the output of NOR gate 526 is only high when all of the output bits of the match code signal "mt<7:0>" are low, indicating a match, and the output command finish signal 542 is high.

Figure 9:
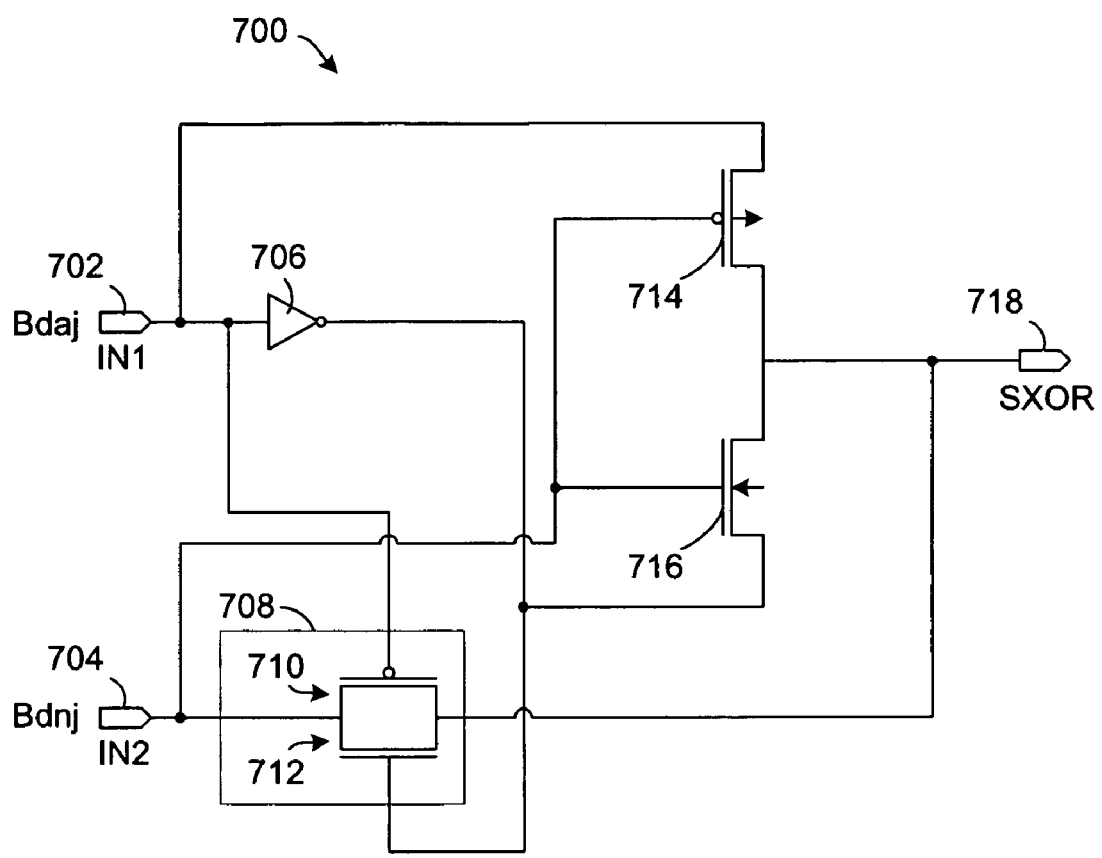
FIG. 9 is a circuit diagram of an example of exclusive OR (EXOR) circuitry of the comparator shown in FIG. 8.

FIG. 9 shows an example of the EXOR logic gate 512 of FIGS. 8 and 7. Each of the device address DA and the device number ID has 8 bits and the EXOR logic gate includes 8 EXOR gates. FIG. 9 shows only one-bit EXOR gate circuitry for simplicity. Thus, the EXOR logic gate 512 has 8 EXOR gate circuitry as shown in FIG. 9.

Referring to FIG. 9, an example EXOR logic gate 700 includes a first input "IN1" 702 for receiving a j bit Bdai of the device address DA<7:0>, a second input "IN2" 704 for receiving a j bit Bidj of the device ID number DN<7:0>, and an output 718 for providing a logic output signal SXOR. The EXOR logic gate 700 includes an inverter 706, a transmission gate 708, a PMOS transistor 714, an NMOS transistor 716. The transmission gate 708 includes PMOS and NMOS transistors 714, 716, each of which has a gate, a drain and a source. The drain and source of the PMOS transistor 710 are connected to the drain and source of the NMOS transistor 712. The first input 702 is connected to an input of the inverter 706, the source of the PMOS transistor 714 and the gate of the PMOS transistor 710. The second input 704 is connected to the gates of the PMOS and NMOS transistors 714, 716 and to the connected drains of the PMOS and NMOS transistors 710, 712. The output of the inverter 706 is connected to the gate of the NMOS transistor 712 and to the source of the NMOS transistor 716. The drain of the PMOS transistor 714 is connected to the drain of the NMOS transistor 716, and the connected drains of the PMOS and NMOS transistors and the connected sources of the PMOS and NMOS transistors 710, 712 are connected to the output 718.

In operation, the EXOR logic gate 700 operates according to the following truth table:

| Device Address Bit Bdaj | Device ID Bit Bidj | Output Bit of SXOR |
| --- | --- | --- |
| 0 | 0 | 0 |
| 1 | 0 | 1 |
| 0 | 1 | 1 |
| 1 | 1 | 0 |

The example of the comparator 190 shown in FIG. 8 performs the single data rate operation. The circuitry including the comparator may perform double data rate operation. In the DDR operation, the comparator 190 can be configured by the same circuitry shown in FIG. 8 with circuitry for series connection timing margin.

In the embodiments described above, the device elements and circuits are connected to each other as shown in the Figures, for the sake of simplicity. In practical applications of the present invention, elements, circuits, etc. may be connected directly to each other. As well, elements, circuits etc. may be connected indirectly to each other through other elements, circuits, etc., necessary for operation of the devices or apparatus. Thus, in actual configuration of devices and apparatus, the elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A memory device for use in an arrangement of memory devices interconnected in series, the memory device comprising:
    a first input for receiving a command input signal containing a command having an identification number;
    a second input for receiving a first strobe signal indicating the start of the command;
    a third input for receiving clock input;
    a fourth input for receiving a second strobe signal, and
    logic circuitry configured to:
        de-select the memory device in response to the first strobe signal to place the memory device in a de-selected state;
        determine whether the identification number of the command matches a device address associated with the memory device;
        in response to a determination result, place the memory device in a selected state,
        forward the command input signal and the first strobe signal with a delay related to clock cycle latency while the memory device is in the de-selected state;
        refrain from forwarding the command input signal and the first strobe signal while the memory device is in the selected state; and
        forward the second strobe signal with a delay related to a latency that is substantially equal to the latency of a delayed version of the first strobe signal, the second strobe signal containing data enabling data output from the memory device in the selected state.

2. The memory device of claim 1 wherein the logic circuitry is further configured to:
    refrain from forwarding the command input signal and the first strobe signal while the memory device is in the selected state; and transfer the command input signal and the first strobe signal while the memory device is in the de-selected state.

3. The memory device of claim 2 further comprising a third input for receiving clock input, wherein the command input signal is forwarded with a delay related to clock cycle latency while the memory device is in the de-selected state.

4. The memory device of claim 1 further comprising:
a first delay element for providing a delay relating to a clock latency to produce the delayed version of the command input signal;
a second delay element for providing a delay relating to a clock cycle latency to produce the delayed version of the first strobe signal; and
a third delay element for providing a delay relating to a clock cycle latency to produce the delayed version of the second strobe signal.

5. The memory device of claim 1 wherein the logic circuitry comprises:
a comparator for comparing the identification number of the command with the device address associated with the memory device to produce the determination result, and
a pulse producer for producing a pulse responsive to a command strobe on the second input.

6. The memory device of claim 5 wherein the comparator is configured to:
place the memory device in the selected state by asserting an ID match signal and place the memory device in the de-selected state by de-asserting the ID match signal.

7. The memory device of claim 6 wherein each of the device address associated with the memory device and the identification number of the command comprises N-bit binary codes, N being an integer greater than one, the comparator comprises:
exclusive OR circuitry for comparing the device address associated with the memory device to the identification number of the command on a bit-wise basis to produce an N-bit match code signal; and
combinatorial logic circuitry for combining the N-bit match code signal to produce the ID match signal, such that the ID match signal is asserted if each bit of the N-bit match code signal indicates a match, and de-asserted if at least one bit of the N-bit match code signal does not indicate a match.

8. The memory device of claim 7 wherein the comparator further comprises:
a latch for latching the pulse from the pulse generator, wherein the combinatorial logic circuitry combines the N-bit match code signal with an output of the latch, such that the ID match signal is de-asserted in response to the pulse being latched.

9. The memory device of claim 8 wherein the combinatorial logic circuitry comprises:
an alternating cascade of NOR and NAND gates for combining the N signals of the N-bit match code signal and the output of the latch to produce the ID match signal.

10. The memory device of claim 9 wherein N is equal to 8 and the alternating cascade of NOR and NAND gates comprises:
four NOR gates respectively connected to two of the 8 signals of the N-bit match code signal;
two NAND gates having inputs respectively connected to outputs of two NOR gates of the four NOR gates, wherein one NAND gate of the two NAND gates has an input connected to the output of the latch; and a fifth NOR gate having two inputs connected to an output of each of the two NAND gates, wherein the ID match signal is based on an output of the fifth NOR gate.

11. The memory device of claim 8 further comprising:
control logic and memory having an internal clock generator, the internal clock generator including a command clock generator for generating a command clock while the memory device is in the selected state.

12. The memory device of claim 11 wherein the latch comprises two cross-coupled NAND gates.

13. The memory device of claim 12 wherein the two cross-coupled NAND gates comprise a two-input NAND gate and a three-input NAND gate, wherein:
an inverted version of the command clock is an input of the two-input NAND gate of the latch; and
an inverted version of the pulse from the pulse generator is an input of the three-input NAND gate of the latch.

14. The memory device of claim 8 wherein the memory device operates synchronously with clocks.

15. The memory device of claim 1 wherein the command input signal comprises any one of: a serial link and a parallel link.

16. A method in a memory device in an arrangement of memory devices interconnected in series, the method comprising:
receiving a command input signal containing a command having an identification number;
receiving a first strobe signal indicating the start of the command;
de-selecting the memory device when the first strobe signal is received to place the memory device in a de-selected state;
determining whether the identification number of the command matches a device address associated with the memory device;
placing the memory device in a selected state if the identification number of the command matches the device address associated with the memory device,
forwarding a delayed version of the first strobe signal with a delay relating to a clock cycle latency while the memory device is in the de-selected state;
receiving a second strobe signal containing data strobes enabling data output from the memory device in the selected state; and
forwarding a delayed version of the second strobe signal with a latency that is substantially equal to the latency of the delayed version of the first strobe signal.

17. The method of claim 16 further comprising:
refraining from forwarding the command input signal and the first strobe signal with delays while the memory device is in the selected state.

18. The method of claim 17 wherein the step of forwarding comprises:
forwarding a delayed version of the command input signal with approximately a 1 clock cycle latency while the memory device is in the de-selected state.

19. The method of claim 17 wherein the de-selecting the memory device comprises:
generating a pulse responsive to the first strobe signal; and
placing the memory device in the de-selected state responsive to the pulse.

20. The method of claim 16 wherein the de-selecting the memory device comprises de-asserting an ID match signal and the placing the memory device comprises asserting the ID match signal.

* * * * *

UNITED STATES PATENT AND TRADEMARK OFFICE
CERTIFICATE OF CORRECTION

PATENT NO. : 7,751,272 B2  Page 1 of 1
APPLICATION NO. : 12/025866
DATED : July 6, 2010
INVENTOR(S) : Hong Beom Pyeon It is certified that error appears in the above-identified patent and that said Letters Patent is hereby corrected as shown below:

Title page
Under the References Cited item [56] insert

--20040199721 A1, 10/2004, Becca, et al--

Signed and Sealed this

Seventh Day of September, 2010

David J. Kappos
*Director of the United States Patent and Trademark Office*